(12) United States Patent
Pan et al.

(10) Patent No.: US 12,231,117 B2
(45) Date of Patent: Feb. 18, 2025

(54) INTEGRATED CIRCUIT AND METHOD OF MANUFACTURING SAME

(71) Applicants: TAIWAN SEMICONDUCTOR MANUFACTURING COMPANY, LTD., Hsinchu (TW); TSMC CHINA COMPANY, LIMITED, Shanghai (CN); TSMC NANJING COMPANY, LIMITED, Suzhou (CN)

(72) Inventors: Lei Pan, Hsinchu (TW); Yaqi Ma, Hsinchu (TW); Jing Ding, Hsinchu (TW); Zhang-Ying Yan, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 18/346,723

(22) Filed: Jul. 3, 2023

(65) Prior Publication Data
US 2023/0353143 A1    Nov. 2, 2023

Related U.S. Application Data

(62) Division of application No. 17/508,176, filed on Oct. 22, 2021, now Pat. No. 11,695,413.

(30) Foreign Application Priority Data

Sep. 22, 2021   (CN) .......................... 202111106999.4

(51) Int. Cl.
*H01L 27/02* (2006.01)
*H03K 17/687* (2006.01)

(52) U.S. Cl.
CPC ...... *H03K 17/6872* (2013.01); *H01L 27/0251* (2013.01); *H01L 27/0274* (2013.01)

(58) Field of Classification Search
CPC ........... H03K 17/6872; H03K 17/6871; H03K 17/687; H03K 17/6874; H01L 27/0274; (Continued)

(56) References Cited

U.S. PATENT DOCUMENTS 5,341,033 A * 8/1994 Koker .................... H03K 3/013
                                                              327/384
7,260,442 B2   8/2007 Hwang et al.
(Continued)

*Primary Examiner* — Jung Kim
(74) *Attorney, Agent, or Firm* — Hauptman Ham, LLP

(57) ABSTRACT

A Schmitt trigger circuit includes a first and second set of transistors, a first and second feedback transistor, and a first and second circuit. The first set of transistors is connected between a first voltage supply and an output node. The first voltage supply has a first voltage. The second set of transistors is connected between the output node and a second voltage supply. The second voltage supply has a second voltage. The first feedback transistor is connected to the output node, a first node and a second node. The second feedback transistor is connected to the output node, a third node and a fourth node. The first circuit is coupled to and configured to supply the second supply voltage to the second node. The second circuit is coupled to and configured to supply the first supply voltage to the fourth node.

19 Claims, 19 Drawing Sheets

(58) Field of Classification Search
CPC ............. H01L 27/0266; H01L 27/0251; H01L 27/0248

See application file for complete search history.

(56) References Cited

U.S. PATENT DOCUMENTS

| | | |
|---|---|---|
| 9,256,709 B2 | 2/2016 | Yu et al. |
| 2014/0040838 A1 | 2/2014 | Liu et al. |
| 2014/0145699 A1 | 5/2014 | Choy et al. |
| 2015/0278429 A1 | 10/2015 | Chang |

\* cited by examiner

INTEGRATED CIRCUIT AND METHOD OF MANUFACTURING SAME

The present application is a divisional of U.S. application Ser. No. 17/508,176, filed Oct. 22, 2021, now U.S. Pat. No. 11,695,413, issued Jul. 4, 2023, which claims the priority of China Application No. 202111106999.4, filed Sep. 22, 2021, which are herein incorporated by reference in their entireties.

BACKGROUND

The semiconductor integrated circuit (IC) industry produces a wide variety of analog and digital devices to address issues in a number of different areas. As ICs have become smaller and more complex, operating voltages of these analog and digital devices are reduced, affecting the operating voltages of these digital devices and overall IC performance. Furthermore, ICs with reduced operating voltages are susceptible to electrostatic discharge (ESD). ESD causes harmful effects to solid state electronic components, such as integrated circuits if not taken into account.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
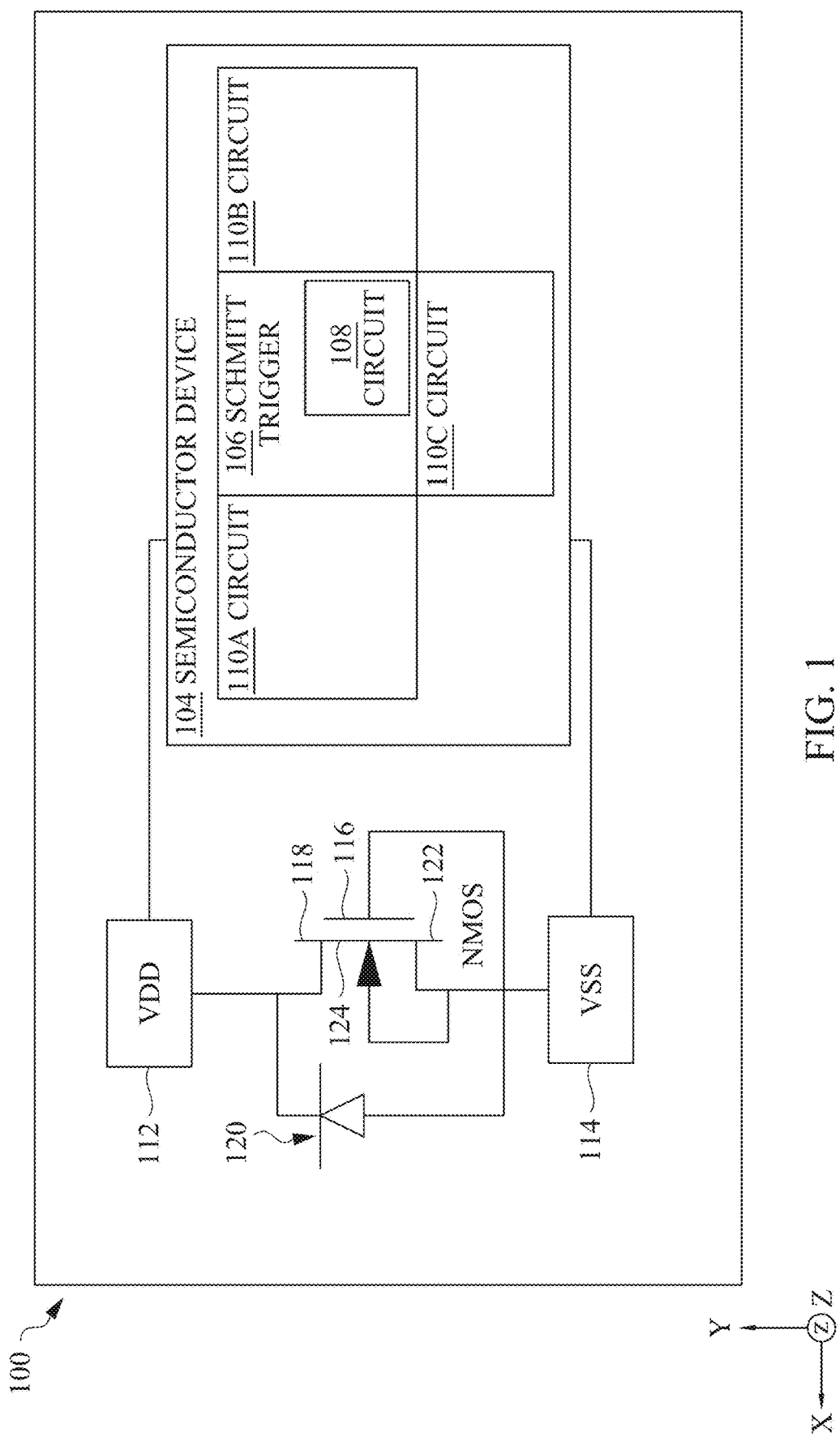
FIG. 1 is a block diagram of an IC, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a Schmitt trigger circuit coupled in parallel with an ESD circuit. In some embodiments, the Schmitt trigger circuit includes a first set of transistors and a second set of transistors. The first set of transistors is connected between a first voltage supply and an output node. The first voltage supply has a first voltage. The second set of transistors is connected between the output node and a second voltage supply. In some embodiments, the second voltage supply has a second voltage different from the first voltage.

In some embodiments, the Schmitt trigger circuit further includes a first feedback transistor and a second feedback transistor. The first feedback transistor is connected to the output node, a first node between the first set of transistors, and a second node. The second feedback transistor is connected to the output node, a third node between the second set of transistors, and a fourth node.

In some embodiments, the Schmitt trigger circuit further includes a first circuit electrically connected to the second node, the first voltage supply and the second voltage supply. In some embodiments, the first circuit is configured to supply the second supply voltage to the second node.

In some embodiments, the Schmitt trigger circuit further includes a second circuit electrically connected to the fourth node, the first voltage supply and the second voltage supply. In some embodiments, the second circuit is configured to supply the first supply voltage to the fourth node.

In some embodiments, by incorporating the first and second circuit in the integrated circuit one or more parasitic transistors within the integrated circuit are not turned on during an ESD event at the first voltage supply or the second voltage supply, thereby resulting in improved ESD performance compared to other approaches.

FIG. 1 is a block diagram of an IC 100, in accordance with some embodiments.

IC 100 includes a gate grounded n-type metal oxide semiconductor (GGNMOS) transistor 102 connected between a voltage supply 112 (e.g., VDD) and a reference voltage supply 114 (e.g., VSS). A gate 116 of GGNMOS transistor 102 is coupled to a reference voltage supply 114 (e.g., VSS).

A drain 118 of GGNMOS transistor 102 is coupled to voltage supply 112. A source 122 of GGNMOS transistor 102 is coupled to voltage supply 114, gate 116, and a body 124 or bulk of GGNMOS transistor 102. The body 124 or bulk of GGNMOS transistor 102 is further coupled to reference voltage supply 114. GGNMOS transistor 102 further includes a body diode 120 connected between voltage supply 112 (e.g., VDD) and reference voltage supply 114 (e.g., VSS), and is connected across the drain 118 and the source 122 of GGNMOS transistor 102. In some embodiments, during an ESD event at the reference voltage supply 114, the body diode is configured to provide an additional ESD discharge path (e.g., in addition to the path between the drain/source of GGNMOS transistor 102) between the reference voltage supply 114 (e.g., VSS) and the voltage supply 112 (e.g., VDD).

Other numbers of circuits, or circuit types for GGNMOS transistor 102 are within the scope of the present disclosure. For example, in some embodiments, GGNMOS transistor 102 is a diode, a gate grounded p-type metal oxide semiconductor (GGPMOS) transistor or other suitable structures are within the contemplated scope of the disclosure.

IC 100 further includes a semiconductor device 104. GGNMOS transistor 102 is connected in parallel with semiconductor device 104.

Semiconductor device 104 includes a Schmitt trigger circuit 106 abutted on one or more sides by one or more of circuits 110A, 110B, and 110C (hereinafter circuit 110).

Schmitt trigger circuit 106 includes a circuit 108. Schmitt trigger circuit 106 is configured to generate an output signal (not shown) in response to an input signal (not shown). In some embodiments, the input signal includes noisy components, and the Schmitt trigger circuit 106 is configured to remove the noisy components of the input signal in generating the output signal.

By incorporating circuit 108 in Schmitt trigger circuit 106, one or more parasitic PNP or NPN transistors that are part of Schmitt trigger circuit 106 and circuit 110 are not turned on during an ESD event at voltage supply 112 or reference voltage supply 114, thereby resulting in better ESD performance than other approaches. For example, in some embodiments, the one or more parasitic PNP or NPN transistors within Schmitt trigger circuit 106 have a larger breakdown voltage than other approaches, thereby causing the GGNMOS transistor 102 to turn on prior to the breakdown voltage of the Schmitt trigger circuit 106 being reached, and thus resulting in improved ESD performance than other approaches. In some embodiments, an internal voltage or virtual voltage (e.g., VDD or VSS) delivered by circuit 108 to one or more nodes (e.g., node NET2 or NET3 in FIG. 2A and shown below) in the Schmitt trigger circuit 106 thereby causes the one or more parasitic PNP or NPN transistors to not turn on in response to an ESD event. In some embodiments, the one or more nodes in the Schmitt trigger circuit 106 are coupled to voltage supply 112 or reference voltage supply 114 by circuit 108, and thus the one or more nodes in the Schmitt trigger circuit 106 are not directly coupled to voltage supply 112 or reference voltage supply 114 thus causing the one or more parasitic PNP or NPN transistors to turn off or remain turned off.

Circuit 110 includes one or more electronic components, such as resistors, transistors, capacitors, inductors and diodes, or other components or devices within the scope of the present disclosure. In some embodiments, circuit 110 includes logic circuits, and/or memory circuits, and/or the like. In some embodiments, circuit 110 includes microprocessors, field-programmable gate arrays (FPGAs), memories (e.g., RAM, ROM, and flash) and application-specific integrated circuit (ASICs). In some embodiments, circuit 110 includes op-amps, linear regulators, phase locked loops, oscillators and active filters. Other circuits or devices for circuit 110 are within the scope of the present disclosure.

Figure 2A:
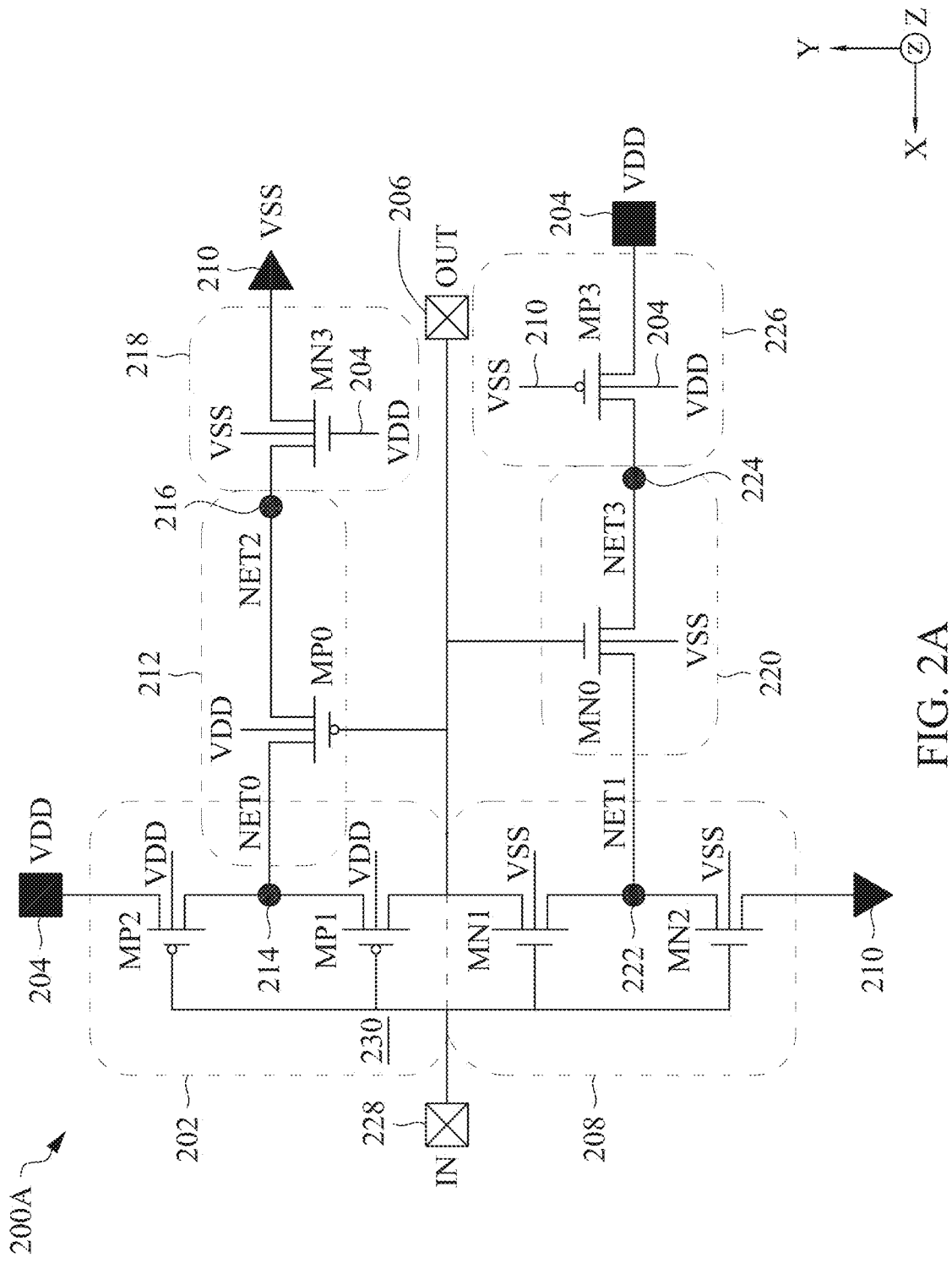
FIG. 2A is a circuit diagram of a Schmitt trigger circuit, in accordance with some embodiments.

FIG. 2A is a circuit diagram of a Schmitt trigger circuit 200A, in accordance with some embodiments.

Schmitt trigger circuit 200A is an embodiment of Schmitt trigger circuit 106 in IC 100, and similar detailed description is therefore omitted.

Schmitt trigger circuit 200A is configured to filter noise present in an input signal IN at input node 228. The output signal OUT of Schmitt trigger circuit 200A has two possible states: high or low. The output signal (not shown) at output node 206 depends upon the input signal and changes once the input signal crosses one or more pre-defined thresholds.

Schmitt trigger circuit 200A includes a set of PMOS transistors 202. The set of PMOS transistors 202 are connected between a first voltage supply 204 and an output node 206. The first voltage supply 204 has a first supply voltage (e.g., VDD).

Schmitt trigger circuit 200A further includes a set of NMOS transistors 208 that are connected between output node 206 and a second voltage supply 210. In some embodiments, second voltage supply 210 is different from first voltage supply 204. Second voltage supply 210 has a second supply voltage (e.g., VSS) different from the first supply voltage (e.g., VDD).

Schmitt trigger circuit 200A further includes a feedback PMOS transistor 212 connected to output node 206 and between a node 214 and a node 216. Node 214 is between the transistors in the set of PMOS transistors 202.

Feedback PMOS transistor 212 will turn on/off in response to at least the voltage at output node 206 (e.g., output signal OUT). In some embodiments, feedback PMOS transistor 212 will turn on in response to the voltage at output node 206 (e.g., output signal OUT), and feedback PMOS transistor 212 will pass a voltage (e.g., second supply voltage VSS-Vth of transistor MP0) from node 216 to node 214. In some embodiments, the voltage at node 214 is a feedback signal from feedback PMOS transistor 212.

Schmitt trigger circuit 200A further includes a circuit 218 electrically connected to node 216, first voltage supply 204 and second voltage supply 210. Circuit 218 is configured to supply the second supply voltage VSS to node 216. By including circuit 218 in Schmitt trigger circuit 200A, circuit 218 is configured to cause a drain or source in the feedback transistor 212 to not be directly connected to second supply voltage VSS, which reduces the possibility one or more parasitic NPN transistors in Schmitt trigger circuit 200A or adjacent circuits from turning on, thereby improving ESD performance in comparison with other approaches. In some embodiments, an element is adjacent to another element if the elements are directly next to each other.

Schmitt trigger circuit 200A further includes a feedback NMOS transistor 220 connected to output node 206, a node 222 and a node 224. Node 222 is between transistors in the set of NMOS transistors 208.

Feedback NMOS transistor 220 will turn on/off in response to at least the voltage at output node 206 (e.g., output signal OUT). In some embodiments, feedback NMOS transistor 220 will turn on in response to the voltage at output node 206 (e.g., output signal OUT), and feedback NMOS transistor 220 will pass a voltage (e.g., first supply voltage VDD-Vth of transistor MN0) from node 224 to node 222. In some embodiments, the voltage at node 222 is a feedback signal from feedback NMOS transistor 220.

Schmitt trigger circuit 200A further includes a circuit 226 electrically connected to node 224, first voltage supply 204 and second voltage supply 210. Circuit 226 is configured to supply the first supply voltage VDD to node 224. By including circuit 226 in Schmitt trigger circuit 200A, circuit 226 is configured to cause a drain or source in the feedback transistor 220 to not be directly connected to first supply voltage VDD, which reduces the possibility one or more parasitic NPN transistors in Schmitt trigger circuit 200A or adjacent circuits from turning on, thereby improving ESD performance in comparison with other approaches.

The set of PMOS transistors 202 includes transistors MP1 and MP2. The set of NMOS transistors 208 includes transistors MN1 and MN2. The feedback NMOS transistor 220 includes transistor MN0. The feedback PMOS transistor 212 includes transistor MP0. The circuit 218 includes transistor MN3. The circuit 226 includes transistor MP3. Each of transistors MN0, MN1, MN2, and MN3 is an NMOS transistor. In some embodiments, each of transistors MP0, MP1, MP2, and MP3 is a PMOS transistor.

In some embodiments, one or more of transistors MN0, MN1, MN2, or MN3 is a PMOS transistor. In some embodiments, one or more of transistors MP0, MP1, MP2, or MP3 is an NMOS transistor.

Each gate terminal of transistors MP1, MP2, MN1 and MN2 are coupled together. The gate terminals of transistors MP1, MP2, MN1 and MN2 are configured to receive an input signal from an input node 228. In some embodiments, transistors MP1, MP2, MN1 and MN2 are configured to invert the input signal. A source terminal of transistor MP2 is coupled to the voltage supply 204.

Each of a drain terminal of transistor MP2, a source terminal of transistor MP1 and a drain/source terminal of transistor MP0 are coupled together. In operation, the drain/source terminal of transistor MP0 is configured to supply a first feedback signal to the source terminal of transistor MP1 or node 214 in response to the output signal at the output node 206 and a gate terminal of MP0. In some embodiments, the drain terminal of transistor MP2 is configured to supply voltage VDD to the source terminal of transistor MP1. In some embodiments, the drain terminal of transistor MP2 in combination with the drain/source terminal of transistor MP0 is configured to set a voltage at the source terminal of transistor MP1.

Each of a drain terminal of transistor MP1, a drain terminal of transistor MN1, gate terminals of transistors MP0 and MN0, and an output node are coupled together.

An output from the drain terminals of transistors MP1 and MN1 is the output signal of Schmitt trigger circuit 200A. In some embodiments, whether MP1 or MN1 is supplying the output signal depends on the input signal. In some embodiments, the output signals of transistors MP1 and MN1 determines whether feedback transistors MP0 or MP1 will turn-on or conduct.

Each of a source terminal of transistor MN1, a drain terminal of transistor MN2 and a drain/source terminal of transistor MN0 are coupled together.

In operation, the drain/source terminal of MN0 is configured to supply a second feedback signal to the source terminal of transistor MN1 and node 222 in response to the output signal at the output node 206 and the gate terminal of MN0. In some embodiments, the drain terminal of transistor MN2 is configured to supply a voltage VSS at the source terminal of transistor MN1. In some embodiments, the drain terminal of transistor MN2 in combination with the drain/source terminal of transistor MN0 is configured to set a voltage at the source terminal of transistor MP1.

A source terminal of transistor MN2 is coupled to the voltage supply 210.

A gate terminal of transistor MN3 is coupled to voltage supply 204. A source terminal of transistor MN3 is coupled to voltage supply 210. A drain terminal of transistor MN3 is coupled to the source/drain terminal of transistor MP0 by node 216. Transistor MN3 is configured to supply the source/drain terminal of transistor MP0 or node 216 with reference voltage VSS.

A gate terminal of transistor MP3 is coupled to voltage supply 210. A source terminal of transistor MP3 is coupled to voltage supply 204. A drain terminal of transistor MP3 is coupled to the source/drain terminal of transistor MN0 by node 224. Transistor MP3 is configured to supply the source/drain terminal of transistor MN0 or by node 224 with voltage VDD.

Each of a body or bulk of transistors MP0, MP1, MP2, and MP3 is coupled to voltage supply 204. Further, each of a body of transistors MN0, MN1, MN2, and MN3 are coupled to voltage supply 210.

Transistor MN3 is electrically connected to node 216, first voltage supply 204 and second voltage supply 210. By at least having the gate terminal of transistor MN3 coupled to first voltage supply 204, transistor MN3 is turned on, is referred to as an "ON" transistor, and therefore is configured to supply the second supply voltage VSS to node 216 and the source/drain terminal of transistor MP0. By including transistor MN3 in Schmitt trigger circuit 200A, transistor MN3 is configured to cause the source/drain terminal of transistor MP0 to not be directly connected to second supply voltage VSS, which reduces the possibility one or more parasitic PNP transistors in Schmitt trigger circuit 200A or adjacent circuits from turning on, thereby improving ESD performance.

Transistor MP3 is electrically connected to node 224, first voltage supply 204 and second voltage supply 210. By at least having the gate terminal of transistor MP3 coupled to second voltage supply 210, transistor MP3 is turned on, is referred to as an "ON" transistor, and therefore is configured to supply the first supply voltage VDD to node 224 and the source/drain terminal of transistor MN0. By including transistor MP3 in Schmitt trigger circuit 200A, transistor MP3 is configured to cause the source/drain terminal of transistor MN0 to not be directly connected to first supply voltage VDD, which reduces the possibility one or more parasitic NPN transistors in Schmitt trigger circuit 200A or adjacent circuits from turning on, thereby improving ESD performance.

Other configurations, number of transistors or transistor types for Schmitt trigger circuit 200A are within the scope of the present disclosure.

Figure 2B:
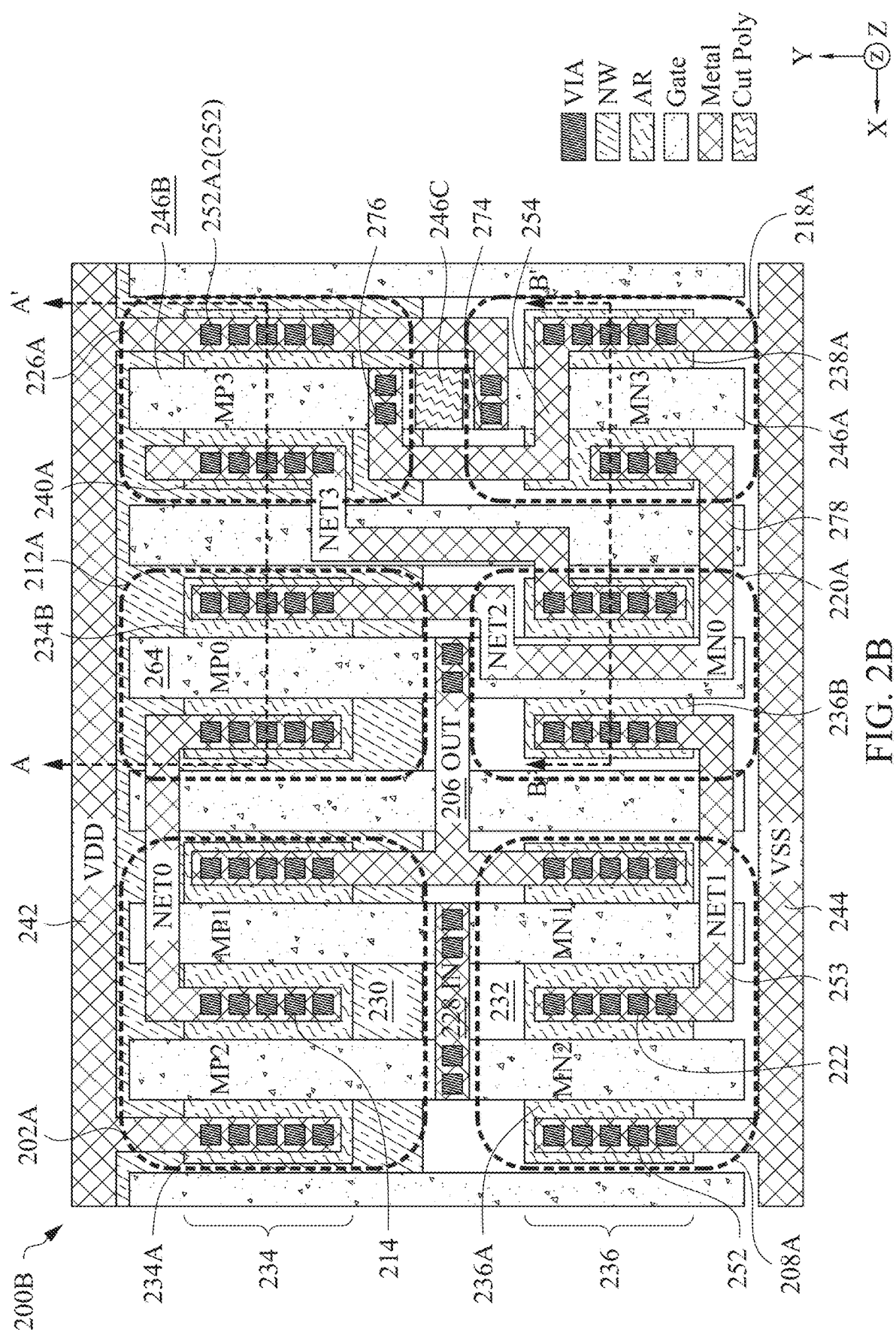
FIGS. 2B-2D are diagrams of an IC, in accordance with some embodiments.
Figure 2C:
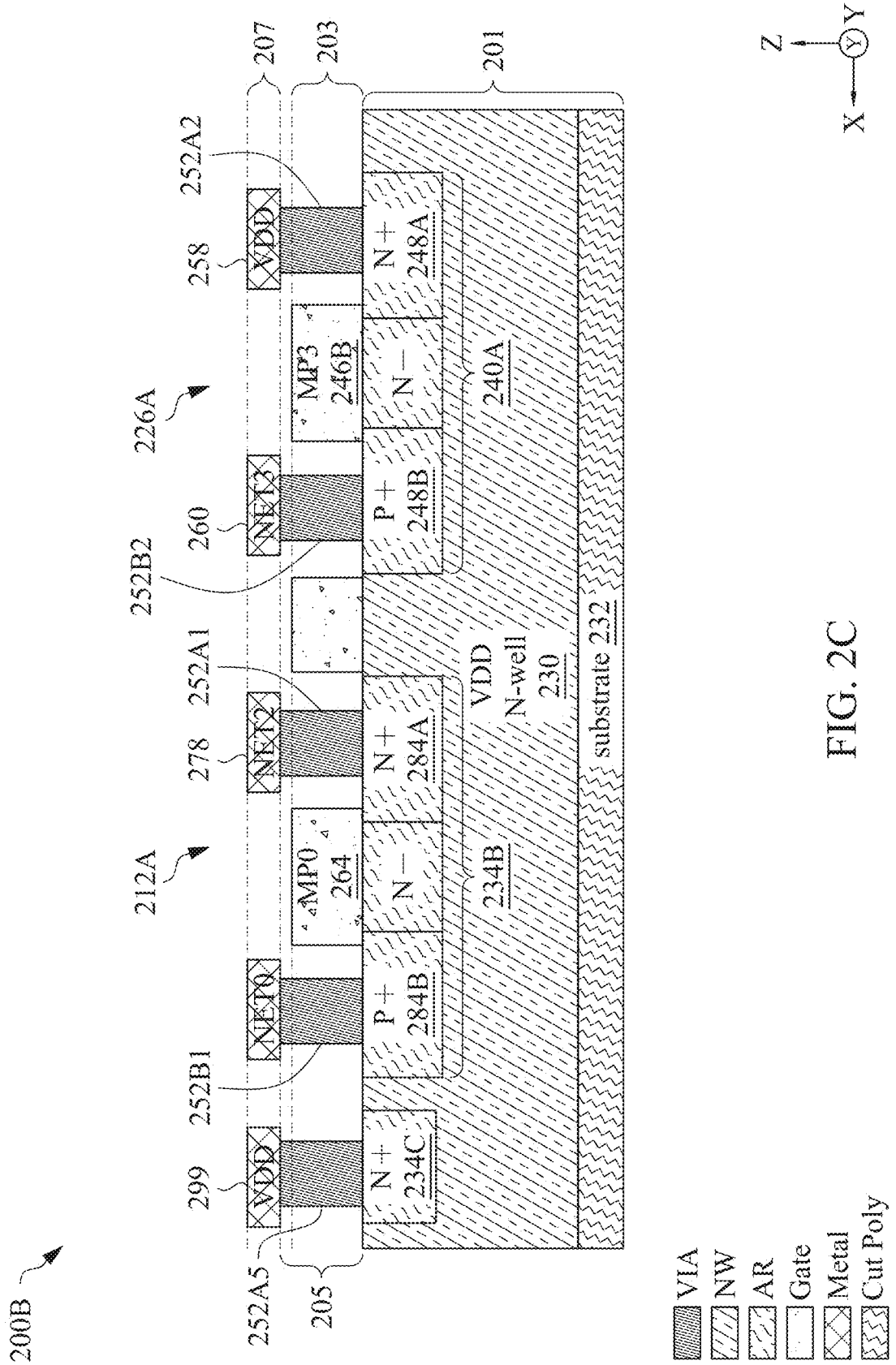
Figure 2D:
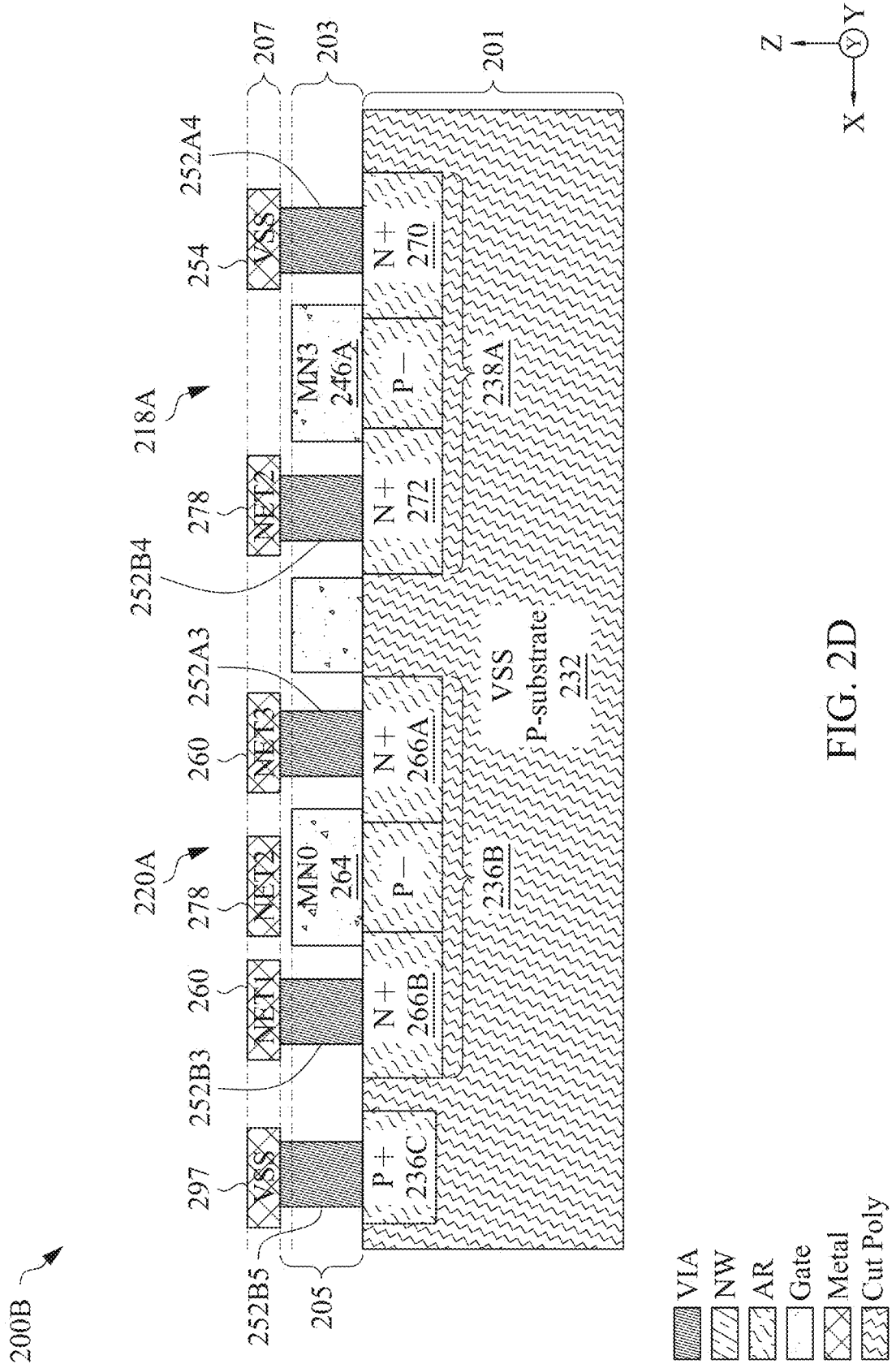

FIGS. 2B-2D are diagrams of an IC 200B, in accordance with some embodiments.

FIG. 2B is top-level view of IC 200B, in accordance with some embodiments.

FIG. 2C is a cross-sectional view of IC 200B as intersected by plane A-A', in accordance with some embodiments.

FIG. 2D is a cross-sectional view of IC 200B as intersected by plane B-B', in accordance with some embodiments.

IC 200B is an embodiment of Schmitt trigger circuit 200A of FIG. 2A, and similar detailed description is therefore omitted.

IC 200B is manufactured based on a corresponding layout design similar to IC 200B. For brevity, FIGS. 2B-2D are described as a corresponding IC 200B, but in some embodiments FIGS. 2B-2D further correspond to layout designs having features similar to IC 200B, and structural elements of IC 200B further correspond to layout patterns, and structural relationships including alignment, lengths and widths, as well as configurations and layers of a corresponding layout design of IC 200B are similar to the structural relationships and configurations and layers of IC 200B, and similar detailed description will not be described for brevity.

For purposes of brevity and succinctness, common reference numerals and elements to the FIGS. 2A, 2B, 2C, and 2D retain the same number. Further, discussion on these elements is not presented again to avoid repetition. Differences between the figures are called out with separate, new reference numerals, and discussion of the differences. Furthermore, similar elements from FIG. 2A correspond to elements in FIGS. 2B-2D with an "A" after the similar reference numeral. For example, the set of PMOS transistors 202 in FIG. 2A correspond to the set of PMOS transistors 202 in FIGS. 2B-2D, and circuit 218 in FIG. 2A corresponds to circuit 218A in FIGS. 2B-2D.

IC 200B includes a substrate 232. The substrate 232 includes a well 230. Well 230 extends in a first direction (e.g., X-axis), and is in substrate 232. Well 230 has a first dopant type. The first dopant type is an N-type dopant. In some embodiments, the n-type dopants include phosphorus, arsenic or other suitable n-type dopants. In some embodiments, well 230 comprises p-type dopants. In some embodiments, the p-dopants include boron, aluminum or other suitable p-type dopants. The substrate 232 has a dopant type opposite of the dopant type of the well 230. The substrate 232 has the second dopant type. In some embodiments, the substrate 232 has the first dopant type.

Substrate 232 further includes a set of active regions 236 and active region 238A.

The set of active regions 236 (including active regions 236A and 236B) is positioned outside of well 230A. The set of active regions 236 extend in a first direction X, are on a first level 201 (FIGS. 2C, 2D), and is separated from set of active regions 234 in a second direction (e.g., Y-axis) different from the first direction. In some embodiments, the first level is the active region of IC 200B. The set of active regions 236 have a dopant type opposite of the dopant type of at least the substrate 232 or the set of active regions 234. The set of active regions 236 have the first dopant type. In some embodiments, the set of active regions 236 have the second dopant type.

Active region 238A is in substrate 232. The active region 238A is next to the set of active regions 236. Active region 238A has the same dopant type as the dopant types of the set of active regions 236.

Well 230 includes a set of active regions 234 and active region 240A.

The set of active regions 234 (including active regions 234A, 234B) extend in the first direction and are on a first level 201 (FIGS. 2C, 2D), and is in well 230A. The set of active regions 234 have a dopant type opposite of the dopant type of the well 230. The set of active regions 234 have the second dopant type. In some embodiments, the set of active regions 234 have the first dopant type.

Active region 240A is in well 230A. Active region 240A is next to the set of active regions 234. Active region 240A has the same dopant type as the dopant types of the set of active regions 234.

IC 200B further include a set of transistors 202A and feedback transistor 212A. Set of active regions 234 corresponds to the active regions of the set of transistors 202A and feedback transistor 212A. The set of transistors 202A includes transistors MP2 and MP1.

IC 200B further includes a set of transistors 208A and feedback transistor 220A. Set of active regions 236 corresponds to the active regions of the set of transistors 208A and feedback transistor 220A. The set of transistors 208A includes transistors MN2 and MN1.

IC 200B further includes a circuit 226A. Circuit 226A is configured to supply voltage VDD to at least one transistor in set of transistors 208A or feedback transistor 220A. Active region 240A corresponds to the active regions of circuit 226A.

IC 200B further includes a circuit 218A. Circuit 218A is configured to supply voltage VSS to at least one transistor in set of transistors 202A or feedback transistor 212A. Active region 238A corresponds to the active regions of circuit 218A.

IC 200B further includes a power rail 242 configured to supply the voltage VDD to at least circuit 226A. In some embodiments, power rail 242 is further configured to supply the voltage VDD to at least a transistor within set of transistors 202A. For example, power rail 242 is configured to supply voltage VDD to transistor MP2 within the set of transistors 202A. Power rail 242 is electrically connected to at least circuit 226A. Power rail 242 extends in the first direction X, and is on a second level of IC 200B that is different from first level 201. In some embodiments, the second level is a metal-0 (M0) layer of IC 200B. In some embodiments, the second level is a metal-1 (M1) layer of IC 200B. Other metallization layers are within the scope of the present disclosure.

IC 200B further includes a power rail 244 configured to supply the voltage VSS to at least circuit 218A. In some embodiments, power rail 244 is further configured to supply the voltage VSS to at least a transistor in set of transistors 208A. For example, power rail 244 is configured to supply voltage VSS to transistor MN2 within the set of transistors 208A. Power rail 244 is electrically connected to at least circuit 218A. Power rail 208A extends in the first direction X, and is on the second level.

Well 230 is biased at voltage VDD by body/bulk 234C. Well 230 includes active regions 234A. 234B and 240A. Active regions 234A and 240A are configured to receive voltage VDD from power rail 242. Active region 234B is indirectly coupled to power rail 244 by transistor MN3. Thus, active region 234B is not directly coupled to power rail 244 thereby reducing the possibility of parasitic PNP transistors in well 230 and abutting circuits from turning on.

Substrate 230A is biased at voltage VSS by body/bulk 236C. Substrate 230A includes active regions 236A, 236B and 238A. Active regions 236A and 238A are configured to receive voltage VSS from power rail 244. Active region 236B is indirectly coupled to power rail 242 by transistor MP3. Thus, active region 236B is not directly coupled to power rail 242 thereby reducing the possibility of parasitic NPN transistors in substrate 230A and abutting circuits from turning on.

In some embodiments, reduction of PNP and/or NPN parasitic transistors turning on, increases the breakdown voltage of IC 200B resulting in improved ESD performance than other approaches.

Feedback transistor 212A includes transistor MP0. Feedback transistor 220A includes transistor MN0.

Transistors MP0 and MN0 include a gate 264A extending in the second direction, and being on a third level 203 different from first level and the second level. In some embodiments, the third level is the POLY level or the metal over diffusion (MD) level of IC 200B. In some embodiments, the gate 264A is divided into multiple portions that are connected together by other structures.

A source/drain (S/D) region 284A of transistor MP0 is a first portion of active region 234B of first set of active regions 234. An S/D region 284B of transistor MP0 is a second portion of active region 234B of first set of active regions 234.

An S/D region 266A of transistor MN0 is a first portion of active region 236B of second set of active regions 236. An S/D region 266B of transistor MN0 is a second portion of active region 236B of second set of active regions 236.

Circuit 226A includes transistor MP3. Circuit 218A includes transistor MN3.

Transistor MN3 is an NMOS transistor including a gate 246A. Gate 246A is separated from gate 246B by removed gate portion 246C. Gate 246A extends in the second direction, and is on the third level 203. S/D 270 of transistor MN3 and S/D region 272 of transistor MN3 are within active region 238A.

Transistor MP3 is a PMOS transistor including gate 246B, a S/D 248A, and a S/D 248B. Gate 246B extends in the second direction, and is on the third level 203. S/D 248A and S/D 248B are within active region 240A.

IC 200B further includes vias 252, via 274, via 276, and conductive structures 253, 254, 258, 260 and 278.

Vias 252 includes one or more of vias 252A1-252A5 or vias 252B1-252B5. Vias 252 includes other vias shown in FIG. 2B that are not labelled, but are similar to vias 252A1-252A5 or vias 252B1-252B5, and similar detailed description is omitted. Vias 252 are in a via layer 205, and are connected to a conductor layer 207.

Conductive structures 253 include one or more conductive structures labelled with NET0, NET1, OUT and IN, and are not described for brevity, but are similar to conductive structures 254, 258, 260 and 278, and similar detailed description is omitted. Conductive structures 253, 254, 258, 260 and 278 are within conductor layer 207. In some embodiments, conductor layer 207 is on the second level of IC 200B.

Conductive structure 258 is coupled to the power rail 242. Conductive structure 258 is connected to gate 246A of transistor MN3 by via 274. Conductive structure 258 is further connected to S/D 248A of transistor MP3 by via 252A2. Conductive structure 258 is configured to supply gate 246A and S/D 248A with voltage VDD.

Conductive structure 254 is coupled to the power rail 244. Conductive structure 254 is connected to gate 246B of transistor MP3 by via 276. Conductive structure 254 is further connected to S/D 270 of transistor MN3 by via 252A4. Conductive structure 254 is configured to supply gate 246B and S/D 270 with voltage VSS.

Conductive structure 260 connects S/D region 248B of transistor MP3 and S/D region 266A of transistor MN0 together. Conductive structure 260 is connected to S/D region 248B of transistor MP3 by via 252B2. Conductive structure 260 is connected to S/D region 266A of transistor MN0 by via 252A3.

Conductive structure 278 connects S/D region 248B of transistor MN3 and S/D region 266A of transistor MP0 together. Conductive structure 278 is connected to S/D region 272 of transistor MN3 by via 252B4. Conductive structure 278 is connected to S/D region 284A of transistor MP0 by via 252A1.

Body/bulk 234C is connected to voltage supply 204 by via 252A5 and conductive structure 299. Conductive structure 299 is configured to supply voltage VDD to the body/bulk 234C and the body or bulk of other PMOS transistors in IC 200B. In some embodiments, conductive structure 299 is coupled to power rail 242.

Body/bulk 236C is connected to voltage supply 206 by via 252B5 and conductive structure 297. Conductive structure 297 is configured to supply voltage VSS to the body/bulk 236C and the body or bulk of other NMOS transistors in IC 200B. In some embodiments, conductive structure 297 is coupled to power rail 242.

In some embodiments, at least one power rail of power rails 242, 244, at least one via of vias vias 252, via 274, via 276, at least one conductive structure of conductive structures 253, 254, 258, 260 and 278 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Transistors MP3 and MN3 are configured to supply a corresponding voltage VDD and VSS to corresponding feedback transistors 220A and 212A. In some embodiments, by configuring transistor MP3 to supply voltage VDD to feedback transistor 220A, and by configuring transistor MN3 to supply voltage VSS to feedback transistor 212A, active regions 236B and 234B of corresponding feedback transistors 220A and 212A are not directly coupled to voltage supplies 204 and 206, thereby causing one or more parasitic PNP or NPN transistors that are part of or next to IC 200B to turn off or remain off during an ESD event at voltage supplies 204 and 206, thereby resulting in IC 200B to have a larger breakdown voltage and better ESD performance than other approaches.

Figure 3A:
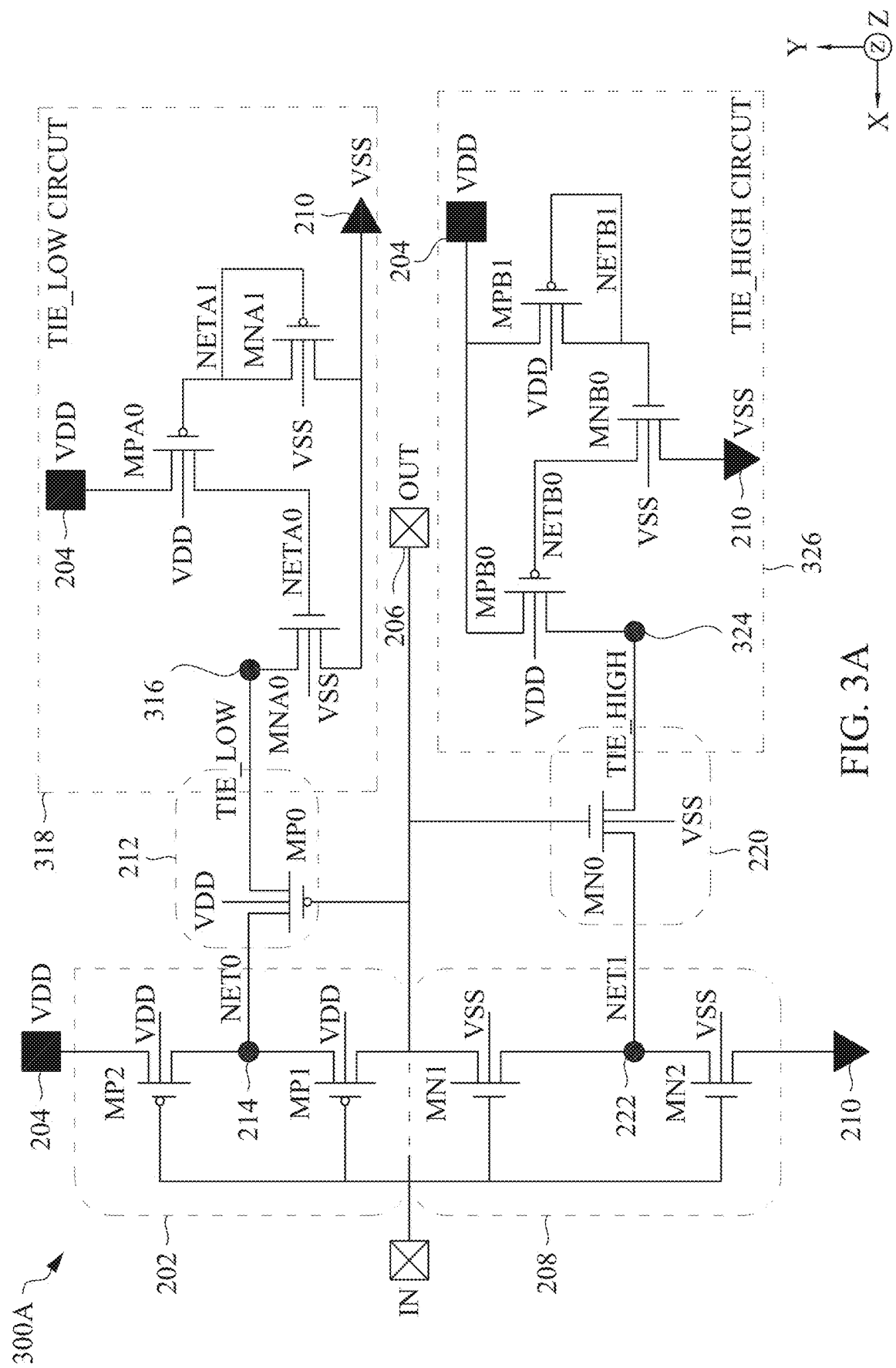
FIG. 3A is a circuit diagram of a Schmitt trigger circuit, in accordance with some embodiments.

FIG. 3A is a circuit diagram of a Schmitt trigger circuit 300A, in accordance with some embodiments.

Schmitt trigger circuit 300A is an embodiment of Schmitt trigger circuit 106 in IC 100, and similar detailed description is therefore omitted.

Schmitt trigger circuit 300A is a variation of Schmitt trigger circuit 200A of FIG. 2A, and similar detailed description is therefore omitted. For example, in comparison with Schmitt trigger circuit 200A of FIG. 2A, a circuit 318 of Schmitt trigger circuit 300A replaces circuit 218 of FIG. 2A, and a circuit 326 of Schmitt trigger circuit 300A replaces circuit 226 of FIG. 2A, node 316 replaces node 216, and node 324 replaces node 224, and similar detailed description is therefore omitted.

Schmitt trigger circuit 300A includes set of PMOS transistors 202, set of NMOS transistors 208, feedback PMOS transistor 212, feedback PMOS transistor 220, and circuits 318 and 326.

Circuit 318 is electrically connected to node 316, first voltage supply 204, second voltage supply 210 and transistor MP0 of feedback transistor 212. Circuit 318 is configured to supply the second supply voltage VSS to node 316 and the drain/source terminal of transistor MP0. By including circuit 318 in Schmitt trigger circuit 300A, circuit 318 is configured to cause a drain or source in the feedback transistor 212 to not be directly connected to second supply voltage VSS, which reduces the possibility one or more parasitic NPN transistors in Schmitt trigger circuit 300A or adjacent circuits from turning on, thereby improving ESD performance.

Circuit 326 is electrically connected to node 324, first voltage supply 204 and second voltage supply 210, transistor MN0 of feedback transistor 220. Circuit 326 is configured to supply the first supply voltage VDD to node 324 and the drain/source terminal of transistor MN0. By including circuit 326 in Schmitt trigger circuit 300A, circuit 326 is configured to cause a drain or source in the feedback transistor 220 to not be directly connected to first supply voltage VDD, which reduces the possibility one or more parasitic NPN transistors in Schmitt trigger circuit 300A or adjacent circuits from turning on, thereby improving ESD performance.

Circuit 318 includes transistors MNA0, MNA1 and MPA0 coupled to each other. Circuit 326 includes transistors MPB0, MPB1 and MNB0 coupled to each other. Each of transistors MNA0, MNA1, MNB0 is an NMOS transistor. Each of transistors MPB0, MPB1, MPA0 is a PMOS transistor.

In some embodiments, one or more of transistors MNA0, MNA1, MNB0 is a PMOS transistor. In some embodiments, one or more of transistors MPB0, MPB1, MPA0 is an NMOS transistor.

Each of a gate terminal of transistor MPA0, a gate terminal and a drain terminal of transistor MNA1 are coupled together. A source terminal of transistor MPA0 is coupled to voltage supply 204. Each of a drain terminal of transistor MPA0 and a gate terminal of transistor MNA0 are coupled together.

Each of a source terminal of transistor MNA0 and a source terminal of transistor MNA1 is coupled to voltage supply 210, and are also coupled together. A drain terminal of transistor MNA0 is coupled to a source/drain terminal of transistor MP0 by node 316. Transistors MPA0, MNA0, and MNA1 are configured to supply the source/drain terminal of transistor MP0 or node 316 with reference voltage VSS.

Each of a gate terminal of MNB0 and a gate and drain terminal of transistor MPB1 are coupled together. A source terminal of transistor MNB0 is coupled to voltage supply 210. Each of a gate terminal of transistor MPB0 and a drain terminal of transistor MNB0 are coupled together.

Each of a source terminal of transistor MPB1 and a source terminal of transistor MPB0 is coupled to voltage supply 204, and are also coupled together. A drain terminal of transistor MPB0 is coupled to the source/drain terminal of transistor MN0 by node 324. Transistors MPB0, MPB1, and MNB0 are configured to supply the source/drain terminal of transistor MN0 or node 324 with voltage VDD.

Each of a body or bulk of transistors MPB0, MPB1, MPA0 is coupled to voltage supply 204. Each of a body or bulk of transistors MNA0, MNA1, MNB0 are coupled to voltage supply 210.

Transistor MNA1 is configured as a diode-coupled transistor since the gate terminal and the drain terminal of transistor MNA1 are coupled together. In some embodiments, transistor MNA1 is configured in saturation mode and is turned on, and is configured to operate as a pull-down resistor. When transistor MNA1 is turned on, and configured as pull-down resistor, the gate and drain terminal of transistor MPA0 are pulled to VSS by being coupled to second voltage supply 210, thereby causing transistor MPA0 to turn on. In response to being turned on, transistor MPA0 couples the gate terminal of transistor MNA0 to first voltage supply 204, thereby causing transistor MNA0 to be turned on. In response to being turned on, transistor MNA0 is configured to supply the second supply voltage VSS to node 316 and the source/drain terminal of transistor MP0. In some embodiments, transistors MPA0 and MNA1 are referred to as a tie-high circuit. In some embodiments, transistor MNA0 is referred to as a tie-low circuit. By including transistors MPA0. MNA0, and MNA1 in Schmitt trigger circuit 300A, transistors MPA0, MNA0, and MNA1 are configured to cause the source/drain terminal of transistor MP0 to not be directly connected to second supply voltage VSS, which reduces the possibility one or more parasitic PNP transistors in Schmitt trigger circuit 300A or adjacent circuits from turning on, thereby improving ESD performance.

Transistor MPB1 is configured as a diode-coupled transistor since the gate terminal and the drain terminal of transistor MPB1 are coupled together. In some embodiments, transistor MPB1 is configured in saturation mode and is turned on, and is configured to operate as a pull-up resistor. When transistor MPB1 is turned on, and configured as pull-up resistor, the gate and drain terminal of transistor MNB0 are pulled to VDD by being coupled to first voltage supply 204, thereby causing transistor MNB0 to turn on. In response to being turned on, transistor MNB0 couples the gate terminal of transistor MPB0 to second voltage supply 210, thereby causing transistor MPB0 to be turned on. In response to being turned on, transistor MPB0 is configured to supply the first supply voltage VDD to node 324 and the source/drain terminal of transistor MN0. In some embodiments, transistors MNB0 and MPB1 are referred to as a tie-low circuit. In some embodiments, transistor MPB0 is referred to as a tic-high circuit. By including transistors MNB0, MPB0, and MPB1 in Schmitt trigger circuit 300A, transistors MNB0, MPB0, and MPB1 are configured to cause the source/drain terminal of transistor MN0 to not be directly connected to first supply voltage VDD, which reduces the possibility one or more parasitic NPN transistors in Schmitt trigger circuit 300A or adjacent circuits from turning on, thereby improving ESD performance.

Other configurations, number of transistors or transistor types for Schmitt trigger circuit 300A are within the scope of the present disclosure.

Figure 3B:
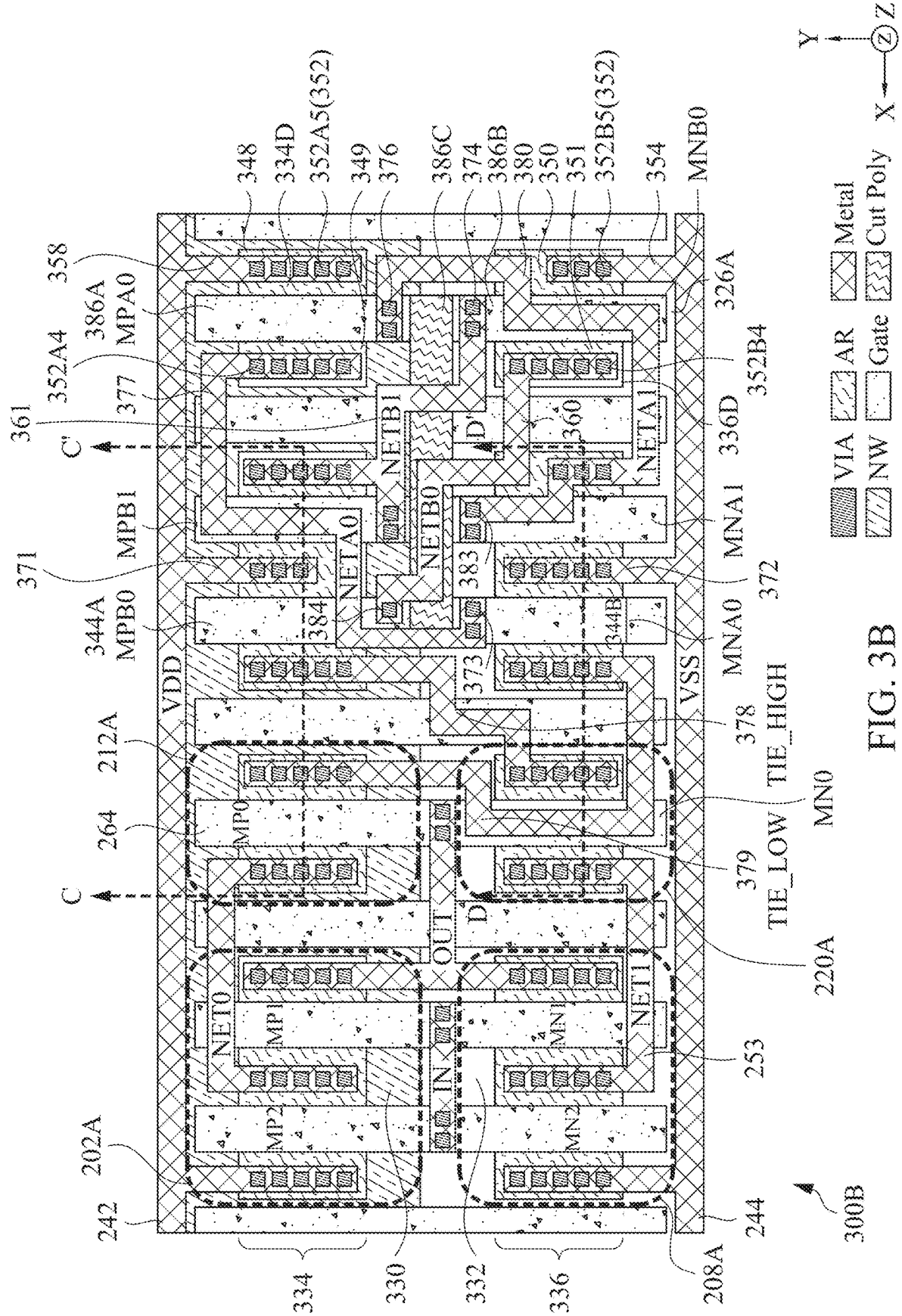
FIGS. 3B-3D are diagrams of an IC, in accordance with some embodiments.
Figure 3C:
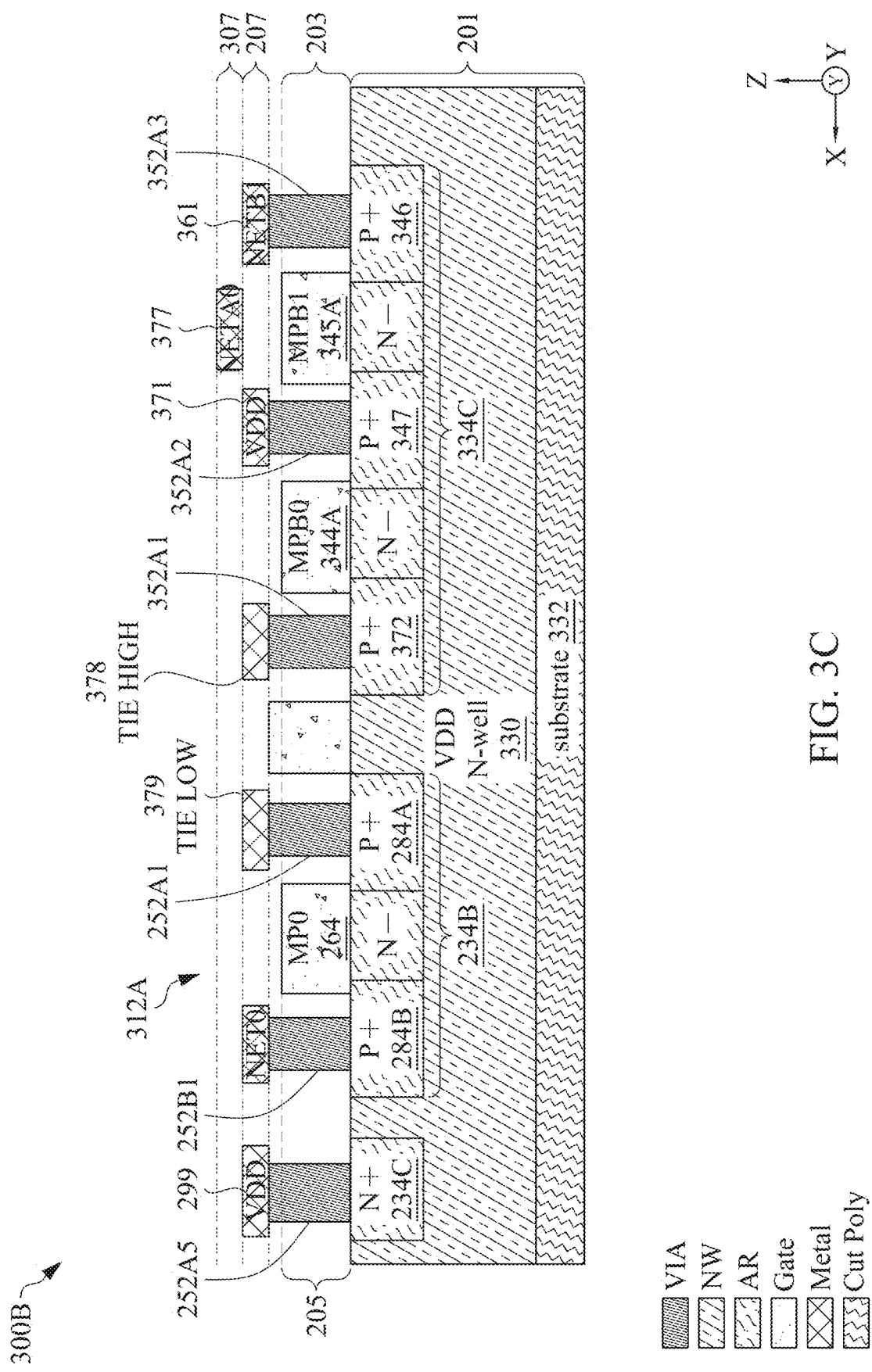
Figure 3D:
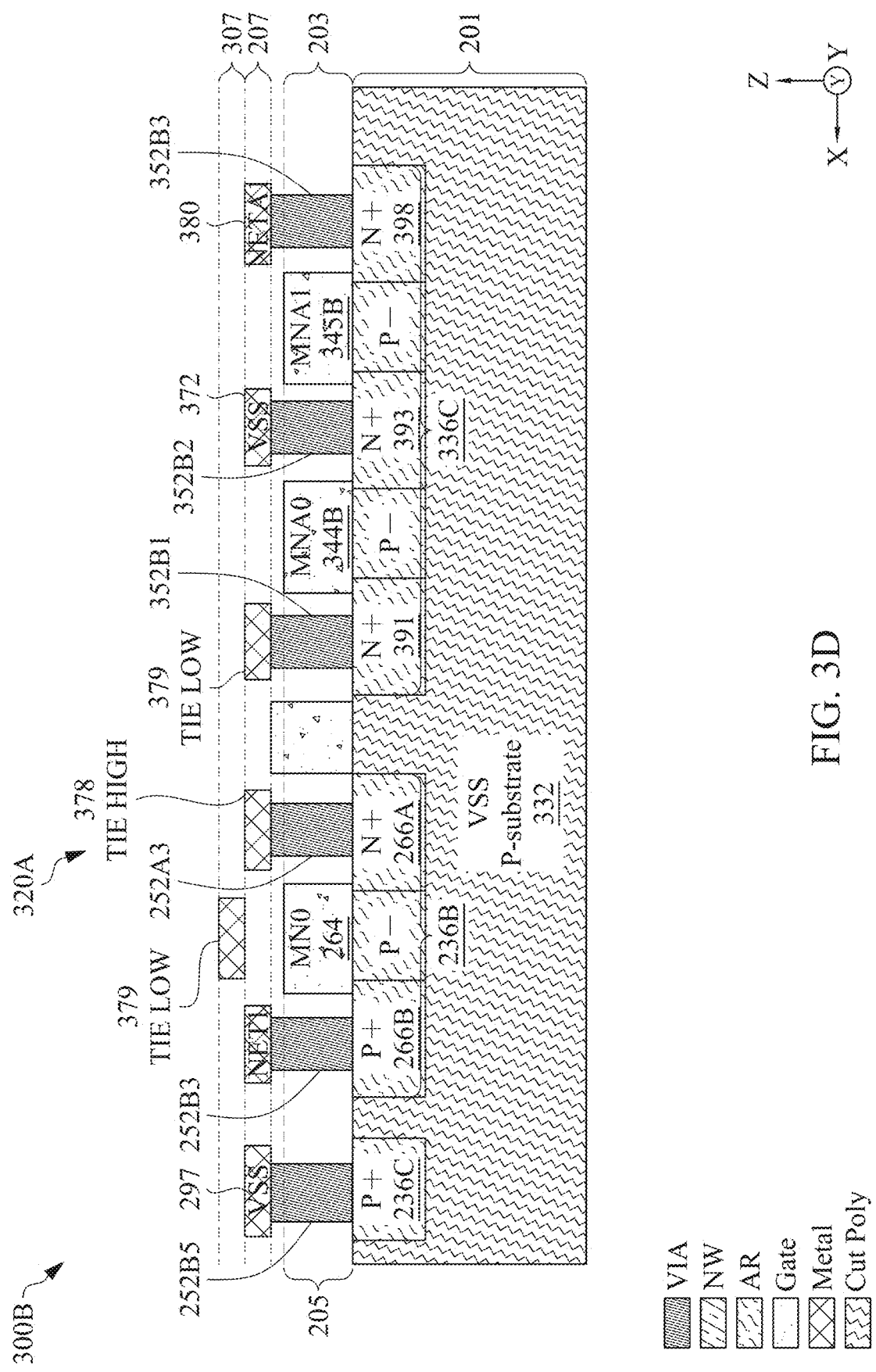

FIGS. 3B-3D are diagrams of an IC 300B, in accordance with some embodiments.

FIG. 3B is top-level view of IC 300B, in accordance with some embodiments.

FIG. 3C is a cross-sectional view of IC 300B as intersected by plane C-C', in accordance with some embodiments.

FIG. 3D is a cross-sectional view of IC 200B as intersected by plane D-D', in accordance with some embodiments.

IC 300B is an embodiment of Schmitt trigger circuit 300A of FIG. 3A, and similar detailed description is therefore omitted.

IC 300B is manufactured based on a corresponding layout design similar to IC 300B. For brevity FIGS. 3B-3D are described as a corresponding IC 300B, but in some embodiments, FIGS. 3B-3D further correspond to layout designs having features similar to IC 300B, and structural elements of IC 300B further correspond to layout patterns, and structural relationships including alignment, lengths and widths, as well as configurations and layers of a corresponding layout design of IC 300B are similar to the structural relationships and configurations and layers of IC 300B, and similar detailed description will not be described for brevity.

For purposes of brevity and succinctness, common reference numerals and elements to the FIGS. 2A-2D and 3A-3D retain the same number. Further, discussion on these elements is not presented again to avoid repetition. Differences between the figures are called out with separate, new reference numerals, and discussion of the differences. Furthermore, similar elements from FIG. 3A correspond to elements in FIGS. 3B-3D with an "A" after the similar reference numeral. For example, circuit 326 in FIG. 3A corresponds to circuit 326A in FIGS. 3B-3D, and circuit 318 in FIG. 3A corresponds to circuit 318A in FIGS. 3B-3D.

IC 300B is a variation of IC 200B of FIGS. 2B-2D, and similar detailed description is therefore omitted. For example, in comparison with IC 200B of FIGS. 2B-2D, a substrate 332 of IC 300B replaces substrate 232 of FIGS. 2B-2D, a well 330 of IC 300B replaces well 230 of FIGS. 2B-2D, a set of active regions 334 of IC 300B replaces active regions 234 and 240A of FIGS. 2B-2D, a set of active regions 336 of IC 300B replaces active regions 236 and 238A of FIGS. 2B-2D, vias 352 of IC 300B replaces vias 252 of FIGS. 2B-2D, a circuit 318A of IC 300B replaces circuit 218A of FIGS. 2B-2D, a circuit 326A of IC 300B replaces circuit 226A of FIGS. 2B-2D, and similar detailed description is therefore omitted.

IC 300B includes substrate 332. The substrate 332 includes well 330 and a set of active regions 336.

The set of active regions 336 (including active regions 236A, 236B, 336C and 336D) is positioned outside of well 330. The set of active regions 336 extend in a first direction X, are on a first level 201 (FIGS. 2C, 2D), and is separated from set of active regions 334 in the second direction. The set of active regions 336 have a dopant type opposite of the dopant type of at least the substrate 332 or the set of active regions 334. The set of active regions 336 have the first dopant type. In some embodiments, the set of active regions 336 have the second dopant type. Each of active regions 236A, 236B, 336C and 336D are separated from each other in the first direction X.

Well 330 is in substrate 332. Well 330 includes a set of active regions 334. The set of active regions 334 (including active regions 234A, 234B, 334C and 334D) extend in the first direction, is on the first level 201 (FIGS. 2C, 2D), and is in well 330A. The set of active regions 334 have a dopant type opposite of the dopant type of the well 330. The set of active regions 334 have the second dopant type. In some embodiments, the set of active regions 334 have the first dopant type. Each of active regions 234A, 234B, 334C and 334D are separated from each other in the first direction X.

IC 300B further include set of transistors 202A and feedback transistor 212A. Active region 234A corresponds to the active regions of transistors MP2 and MP1 of the set of transistors 202A. Active region 234B corresponds to the active regions of transistor MP0 of feedback transistor 212A.

IC 300B further includes set of transistors 208A and feedback transistor 220A. Active region 236A corresponds to the active regions of transistors MN2 and MN1 of the set of transistors 208A. Active region 236B corresponds to the active regions of transistor MN0 of feedback transistor 220A.

IC 300B further includes a circuit 326A. Circuit 326A is configured to supply voltage VDD to at least one transistor in set of transistors 208A or feedback transistor 220A. Active region 334C corresponds to the active regions of transistors MPB0 and MPB1 of circuit 326A. Active region 336D corresponds to the active regions of transistor MNB0 of circuit 326A.

IC 300B further includes a circuit 318A. Circuit 318A is configured to supply voltage VSS to at least one transistor in set of transistors 202A or feedback transistor 212A. Active region 336C corresponds to the active regions of transistors MNA0 and MNA1 of circuit 318A. Active region 334D corresponds to the active regions of transistor MPA0 of circuit 318A.

IC 300B further includes a power rail 242 configured to supply the voltage VDD to at least circuit 326A, circuit 318A, or set of transistors 302A. In some embodiments, power rail 242 is configured to supply the voltage VDD to at least a transistor in circuit 326A or circuit 318A. Power rail 242 is configured to supply voltage VDD to transistor MPA0 within the circuit 318A. Power rail 242 is configured to supply voltage VDD to transistors MPB0 and MPB1 within circuit 326A. Power rail 242 is electrically connected to at least circuit 326A or circuit 318A.

IC 300B further includes a power rail 244 configured to supply the voltage VSS to at least circuit 318A, circuit 326A or set of transistors 308A. In some embodiments, power rail 244 is configured to supply the voltage VSS to at least a transistor in circuit 326A or circuit 318A. Power rail 244 is configured to supply voltage VSS to transistor MNB0 within circuit 326A. Power rail 244 is configured to supply voltage VSS to transistors MNA0 and MNA1 within circuit 318A. Power rail 244 is electrically connected to at least circuit 326A or 318A.

Well 330 is biased at voltage VDD by body/bulk 234C. Well 330 includes active regions 234A, 234B, 234C, 334C and 334D. Active regions 234A, 334C and 334D are configured to receive voltage VDD from power rail 242. Active region 234B is indirectly coupled to power rail 244 by at least transistor MNA0. Thus, active region 234B is not directly coupled to power rail 244 thereby reducing the possibility of parasitic PNP transistors in well 330 and abutting circuits from turning on.

Substrate 330A is biased at voltage VSS by body/bulk 236C. Substrate 330A includes active regions 236A, 236B, 236C, 336C and 336D. Active regions 236A, 336C and 336D are configured to receive voltage VSS from power rail 244. Active region 236B is indirectly coupled to power rail 242 by transistor MPB0. Thus, active region 236B is not directly coupled to power rail 242 thereby reducing the possibility of parasitic NPN transistors in substrate 330A and abutting circuits from turning on.

In some embodiments, reduction of PNP and/or NPN parasitic transistors turning on, increases the breakdown voltage of IC 300B resulting in improved ESD performance than other approaches.

Feedback transistor 212A includes transistor MP0. Feedback transistor 220A includes transistor MN0. Circuit 326A includes at least transistor MPB0, MPB1 or MNB0. Circuit 318A includes transistor MNA0, MNA1 or MPA0.

Transistor MNA0 is an NMOS transistor including a gate 344B, a S/D 391, and a S/D 393. Gate 344B is separated from gate 344A by removed gate portion 386C1. Gate 344A extends in the second direction, and is on the third level. S/D 391 of transistor MNA0 and S/D region 393 of transistors MNA0 and MNA1 are within active region 336C.

Transistor MPB0 is a PMOS transistor including gate 344A, a S/D 372, and a S/D 347. Gate 344A extends in the second direction, and is on the third level 203. S/D 372 of transistor MPB0 and S/D region 347 of transistors MPB0 and MPB1 are within active region 334C.

Transistor MNA1 is an NMOS transistor including a gate 345B, S/D 393, and a S/D 398. Gate 345B is separated from gate 345A by removed gate portion 386C2. Gate 345A extends in the second direction, and is on the third level. S/D 398 of transistor MNA1 is within active region 336C.

Transistor MPB1 is a PMOS transistor including gate 345A, S/D 347, and a S/D 346. Gate 345A extends in the second direction, and is on the third level 203. S/D 346 of transistor MPB1 is within active region 334C.

Transistor MNB0 is an NMOS transistor including a gate 386B, S/D 350, and a S/D 351. Gate 386B is separated from gate 386A by removed gate portion 386C2. Gate 386A extends in the second direction, and is on the third level. S/D 350 of transistor MNB0 and S/D 351 of transistor MNB0 is within active region 336D.

Transistor MPA0 is a PMOS transistor including gate 386A, a S/D 348, and a S/D 349. Gate 386A extends in the second direction, and is on the third level 203. S/D 348 of transistor MPA0 and S/D 349 of transistor MPA0 are within active region 334D.

IC 300B further includes vias 352, via 373, via 374, via 376, vias 383-385, and conductive structures 253, 354, 358, 360, 361, 371, 372 and 377-380.

Vias 352, via 373, via 374, via 376 or vias 383-385 are similar to vias 252 of FIGS. 2B-2D, and similar detailed description is therefore omitted. Vias 352 include one or more of vias 252A1, 252A3, 352A1-352A5, 352B1, 352B3, or 352B1-352B5. Vias 352 include other vias shown in FIG. 3B that are not labelled, but are similar to vias 252A1-252A5 or vias 252B1-252B5, and similar detailed description is omitted.

Conductive structures 253, 354, 358, 360, 361, 371, 372 and 377-380 are similar to conductive structures 254, 258, 260 and 278 of FIGS. 2B-2D, and similar detailed description is therefore omitted.

Conductive structure 354 is coupled to the power rail 244. Conductive structure 354 is connected to S/D 350 of transistor MNB0 by via 352B5. Conductive structure 354 is configured to supply S/D 350 with voltage VSS.

Conductive structure 358 is coupled to the power rail 242. Conductive structure 358 is connected to S/D 348 of transistor MPA0 by via 352A5. Conductive structure 358 is configured to supply S/D 248 with voltage VDD.

Conductive structure 372 is coupled to the power rail 244. Conductive structure 372 is connected to S/D 393 of transistors MNA0 and MNA1 by via 352B2. Conductive structure 372 is configured to supply S/D 393 of transistors MNA0 and MNA1 with voltage VSS.

Conductive structure 371 is coupled to the power rail 242. Conductive structure 371 is connected to S/D 347 of transistors MPB0 and MPB1 by via 352A2. Conductive structure 371 is configured to supply S/D 347 of transistors MPB0 and MPB1 with voltage VDD.

Conductive structure 380 connects gate 345B of transistor MNA1, S/D region 398 of transistor MNA1, and gate 386A of transistor MPA0 together. Conductive structure 380 is connected to gate 345B of transistor MNA1 by via 383. Conductive structure 380 is connected to S/D region 398 of transistor MNA1 by via 352B3. Conductive structure 380 is connected to gate 386A of transistor MPA0 by via 370.

Conductive structure 361 connects gate 345A of transistor MPB1, S/D region 346 of transistor MPB1, and gate 386B of transistor MNB0 together. Conductive structure 361 is connected to gate 345A of transistor MPB1 by via 385. Conductive structure 361 is connected to S/D region 346 of transistor MPB1 by via 352A3. Conductive structure 361 is connected to gate 386B of transistor MNB0 by via 374.

Conductive structure 360 connects gate 344A of transistor MPB0 and S/D region 351 of transistor MNB0. Conductive structure 360 is connected to gate 344A of transistor MPB0 by via 384. Conductive structure 360 is connected to S/D region 351 of transistor MNB0 by via 352B4.

Conductive structure 377 connects gate 344B of transistor MNA0 and S/D region 349 of transistor MPA0. Conductive structure 377 is connected to gate 344B of transistor MNA0 by via 373. Conductive structure 377 is connected to S/D region 349 of transistor MPA0 by via 352A4.

Conductive structure 378 connects S/D region 372 of transistor MPB0 and S/D region 266A of transistor MN0. Conductive structure 378 is connected to S/D region 372 of transistor MPB0 by via 352A1. Conductive structure 378 is connected to S/D region 266A of transistor MN0 by via 252A3.

Conductive structure 379 connects S/D region 391 of transistor MNA0 and S/D region 284A of transistor MP0. Conductive structure 379 is connected to S/D region 391 of transistor MNA0 by via 352B1. Conductive structure 379 is connected to S/D region 284A of transistor MP0 by via 252A1.

Transistors MPB0 and MNA0 are configured to supply a corresponding voltage VDD and VSS to corresponding feedback transistors 220A and 212A. In some embodiments, by configuring transistor MPB0 to supply voltage VDD to feedback transistor 220A, and by configuring transistor MNA0 to supply voltage VSS to feedback transistor 212A, active regions 236B and 234B of corresponding feedback transistors 220A and 212A are not directly coupled to voltage supplies 204 and 206, thereby causing one or more parasitic PNP or NPN transistors that are part of or next to IC 300B to turn off or remain off during an ESD event at voltage supplies 204 and 206, thereby resulting in IC 300B to have a larger breakdown voltage and better ESD performance than other approaches.

Figure 4A:
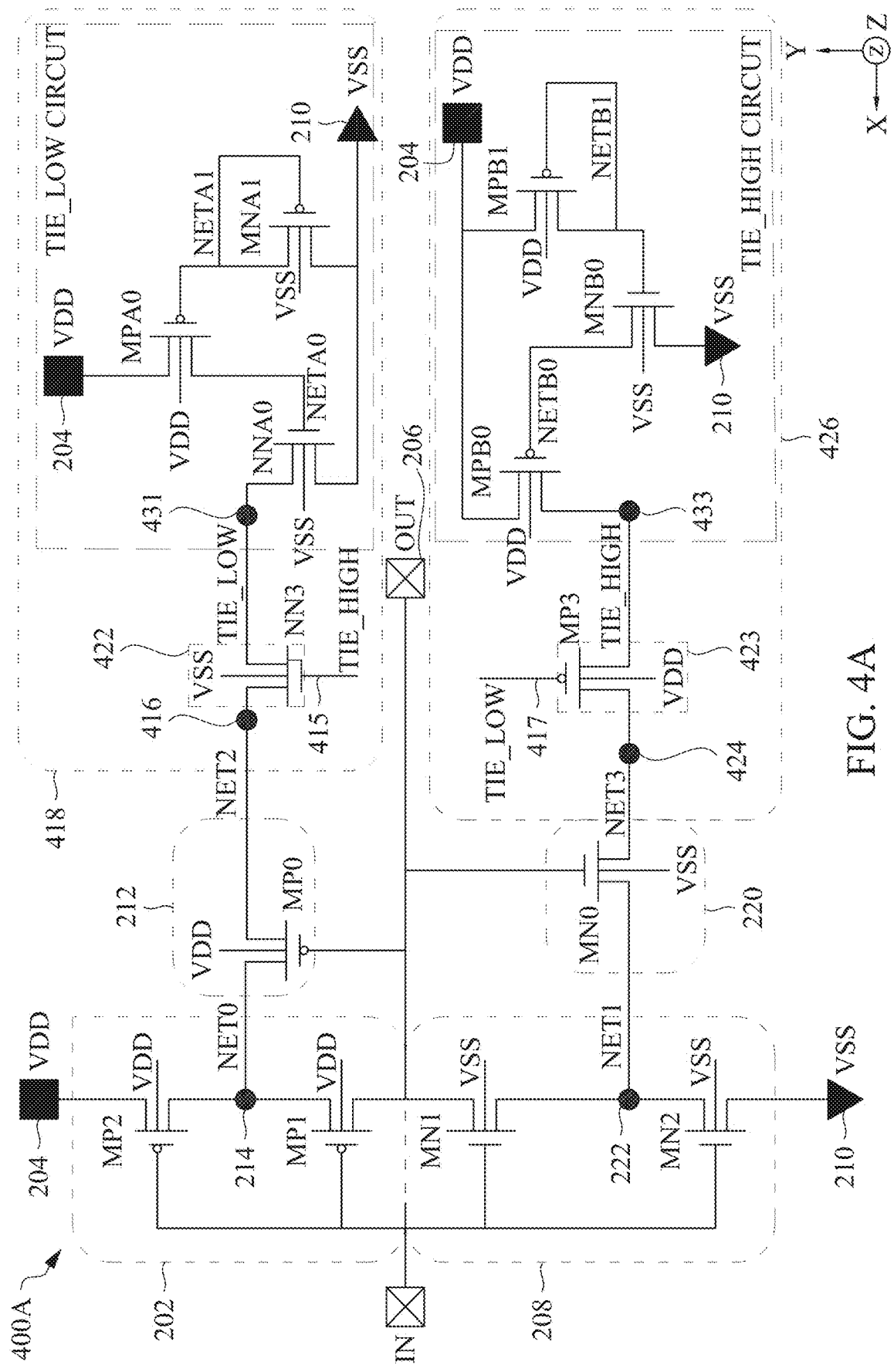
FIG. 4A is a circuit diagram of a Schmitt trigger circuit, in accordance with some embodiments.

FIG. 4A is a circuit diagram of a Schmitt trigger circuit 400A, in accordance with some embodiments.

Schmitt trigger circuit 400A is an embodiment of Schmitt trigger circuit 106 in IC 100, and similar detailed description is therefore omitted.

Schmitt trigger circuit 400A is a variation of Schmitt trigger circuit 200A of FIG. 2A or Schmitt trigger circuit 300A of FIG. 3A, and similar detailed description is therefore omitted. For example, in comparison with Schmitt trigger circuit 300A of FIG. 3A, a circuit 418 of Schmitt trigger circuit 400A replaces circuit 318 of FIG. 3A, and a circuit 426 of Schmitt trigger circuit 400A replaces circuit 326 of FIG. 3A, node 416 replaces node 316, and node 424 replaces node 324, and similar detailed description is therefore omitted.

Schmitt trigger circuit 400A includes set of PMOS transistors 202, set of NMOS transistors 208, feedback PMOS transistor 212, feedback PMOS transistor 220, and circuits 418 and 426.

Circuit 418 is a variation of circuit 318 of FIG. 3A, circuit 426 is a variation of circuit 326 of FIG. 3A, and similar detailed description is therefore omitted. For example, in comparison with circuit 318 of FIG. 3A, circuit 418 further includes transistor 422, and similar detailed description is therefore omitted. Similarly, in comparison with circuit 326 of FIG. 3A, circuit 426 further includes transistor 423, and similar detailed description is therefore omitted.

Circuit 418 is electrically connected to node 416, first voltage supply 204, second voltage supply 210, and transistor MP0 of feedback transistor 212. Circuit 418 is configured to supply the second supply voltage VSS to node 416 and the drain/source terminal of transistor MP0. By including circuit 418 in Schmitt trigger circuit 400A, circuit 418 is configured to cause a drain or source in the feedback transistor 212 to not be directly connected to second supply voltage VSS, which reduces the possibility one or more parasitic NPN transistors in Schmitt trigger circuit 400A or adjacent circuits from turning on, thereby improving ESD performance.

Circuit 426 is electrically connected to node 424, first voltage supply 204 and second voltage supply 210, transistor MN0 of feedback transistor 220. Circuit 426 is configured to supply the first supply voltage VDD to node 424 and the drain/source terminal of transistor MN0. By including circuit 426 in Schmitt trigger circuit 400A, circuit 426 is configured to cause a drain or source in the feedback transistor 220 to not be directly connected to first supply voltage VDD, which reduces the possibility one or more parasitic NPN transistors in Schmitt trigger circuit 400A or adjacent circuits from turning on, thereby improving ESD performance.

Circuit 418 includes transistors MN3, MNA0, MNA1 and MPA0. Circuit 426 includes transistor MP3, MPB0, MPB1, and MNB0. Each of transistors MN3, MNA0, MNA1, MNB0 is an NMOS transistor. Each of transistors, MP3, MPB0, MPB1, MPA0 is a PMOS transistor.

In some embodiments, one or more of transistors MN3, MNA0, MNA1, MNB0 is a PMOS transistor. In some embodiments, one or more of transistors MP3, MPB0, MPB1, MPA0 is an NMOS transistor.

Each of a drain terminal of transistor MNA0 and a source/drain terminal of transistor MN3 are coupled together at node 431.

Each of a gate terminal of transistor MN3, the drain/source terminal of transistor MPB0, and a drain/source terminal of transistor MP3 are coupled together at node 433. The gate terminal of transistor MN3 is configured to receive a signal 415 (e.g., labelled as "TIE-HIGH") that corresponds to a signal of node 433.

Each of a drain/source terminal of transistor MN3 and the source/drain terminal of transistor MP0 are coupled together at node 416.

Transistors MN3, MPA0, MNA0, and MNA1 are configured to supply the source/drain terminal of transistor MP0 or node 416 with reference voltage VSS.

Each of a drain terminal of transistor MPB0 and a source/drain terminal of transistor MP3 are coupled together at node 433.

Each of a gate terminal of transistor MP3, the drain/source terminal of transistor MNA0, and a drain/source terminal of transistor MN3 are coupled together at node 431. The gate terminal of transistor MP3 is configured to receive a signal 417 (e.g., labelled as "TIE-LOW" that corresponds to a signal of node 431.

Each of a drain/source terminal of transistor MP3 and the source/drain terminal of transistor MN0 are coupled together at node 424. Transistor MP3, MPB0, MPB1, and MNB0 are configured to supply the source/drain terminal of transistor MN0 or by node 424 with voltage VDD.

Each of a body or bulk of transistors MP3, MPB0, MPB1, MPA0 is coupled to voltage supply 404. Each of a body of transistors MN3, MNA0, MNA1, MNB0 are coupled to voltage supply 410.

The operation of transistors MPA0, MNA1, and MNA0 of FIG. 4A are similar to FIG. 3A, and are not described for brevity, and similar detailed description is therefore omitted.

The operation of transistors MNB0, MPB1, and MPB0 of FIG. 4A are similar to FIG. 3A, and are not described for brevity, and similar detailed description is therefore omitted.

Transistors MPA0, MNA1, and MNA0 are configured to set the voltage of node 431 at reference voltage VSS. Transistor MN3 is turned on in response to signal TIE-HIGH being equal to voltage VDD, thereby causing node 416 to be coupled to node 431, and the voltage of node 416 is equal to reference voltage VSS.

Transistors MNB0, MPB1, and MPB0 are configured to set the voltage of node 433 at voltage VDD. Transistor MP3 is turned on in response to signal TIE-LOW being equal to reference voltage VSS, thereby causing node 424 to be coupled to node 433, and the voltage of node 424 is equal to voltage VDD.

By including transistors MN3, MPA0, MNA0, and MNA1 in Schmitt trigger circuit 400A, transistors MN3, MPA0, MNA0, and MNA1 are configured to cause the source/drain terminal of transistor MP0 to not be directly connected to second supply voltage VSS, which reduces the possibility one or more parasitic PNP transistors in Schmitt trigger circuit 400A or adjacent circuits from turning on, thereby improving ESD performance. Furthermore, a gate of transistor MN3 in Schmitt trigger circuit 400A is not directly coupled to first voltage supply 204, thereby preventing the gate oxide of the gate of transistor MN3 from rupturing or breaking down in response to ESD events at first voltage supply 204 or second voltage supply 210 resulting in improved ESD performance than other approaches.

By including transistors MP3, MNB0, MPB0, and MPB1 in Schmitt trigger circuit 300A, transistors MP3, MNB0, MPB0, and MPB1 are configured to cause the source/drain terminal of transistor MN0 to not be directly connected to first supply voltage VDD, which reduces the possibility one or more parasitic NPN transistors in Schmitt trigger circuit 400A or adjacent circuits from turning on, thereby improving ESD performance. Furthermore, a gate of transistor MP3 in Schmitt trigger circuit 400A is not directly coupled to second voltage supply 210, thereby preventing the gate oxide of the gate of transistor MP3 from rupturing or breaking down in response to ESD events at first voltage supply 204 or second voltage supply 210 resulting in improved ESD performance than other approaches.

Other configurations, number of transistors or transistor types for Schmitt trigger circuit 400A are within the scope of the present disclosure.

Figure 4B:
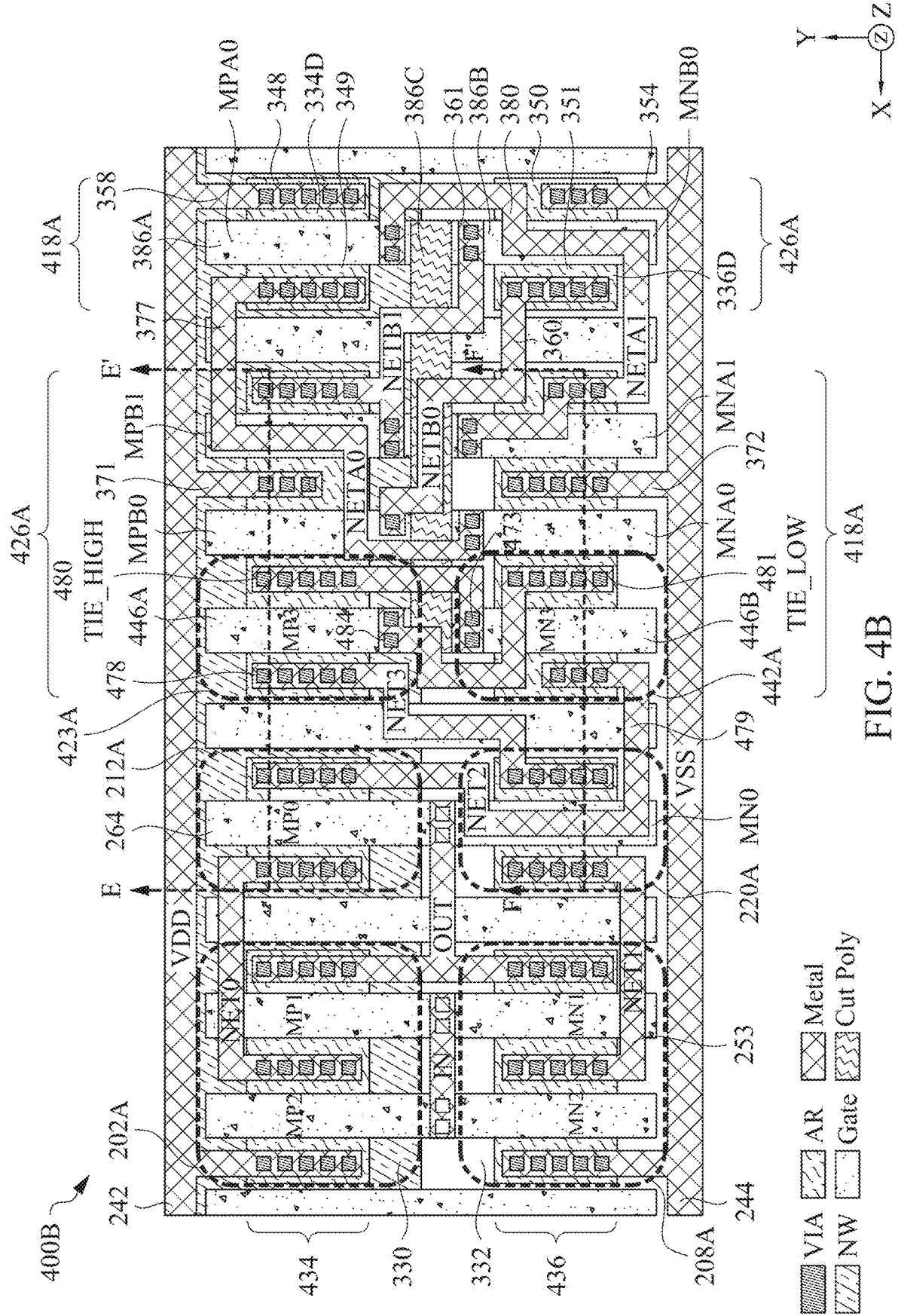
FIGS. 4B-4D are diagrams of an IC, in accordance with some embodiments.
Figure 4C:
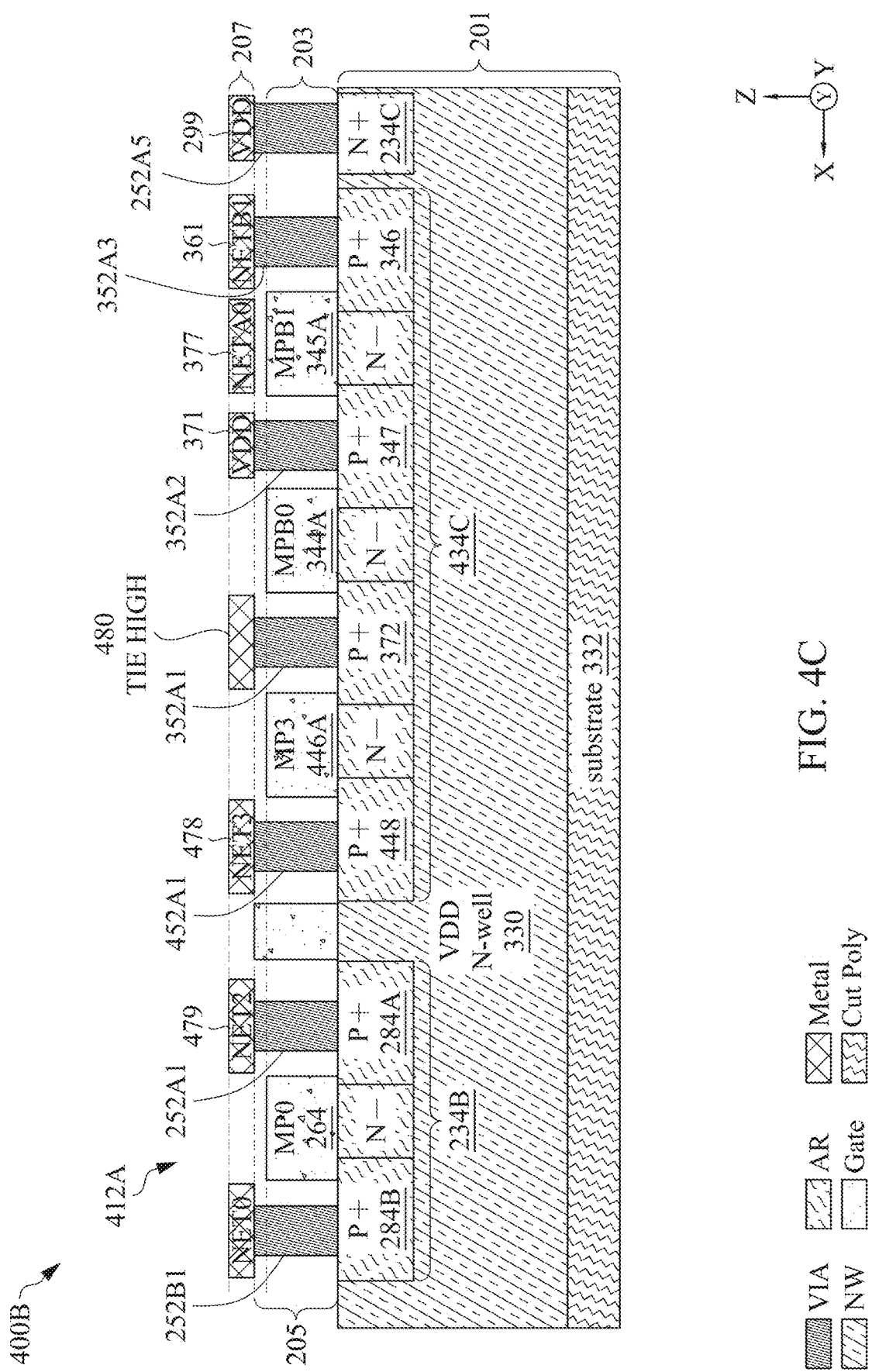
Figure 4D:
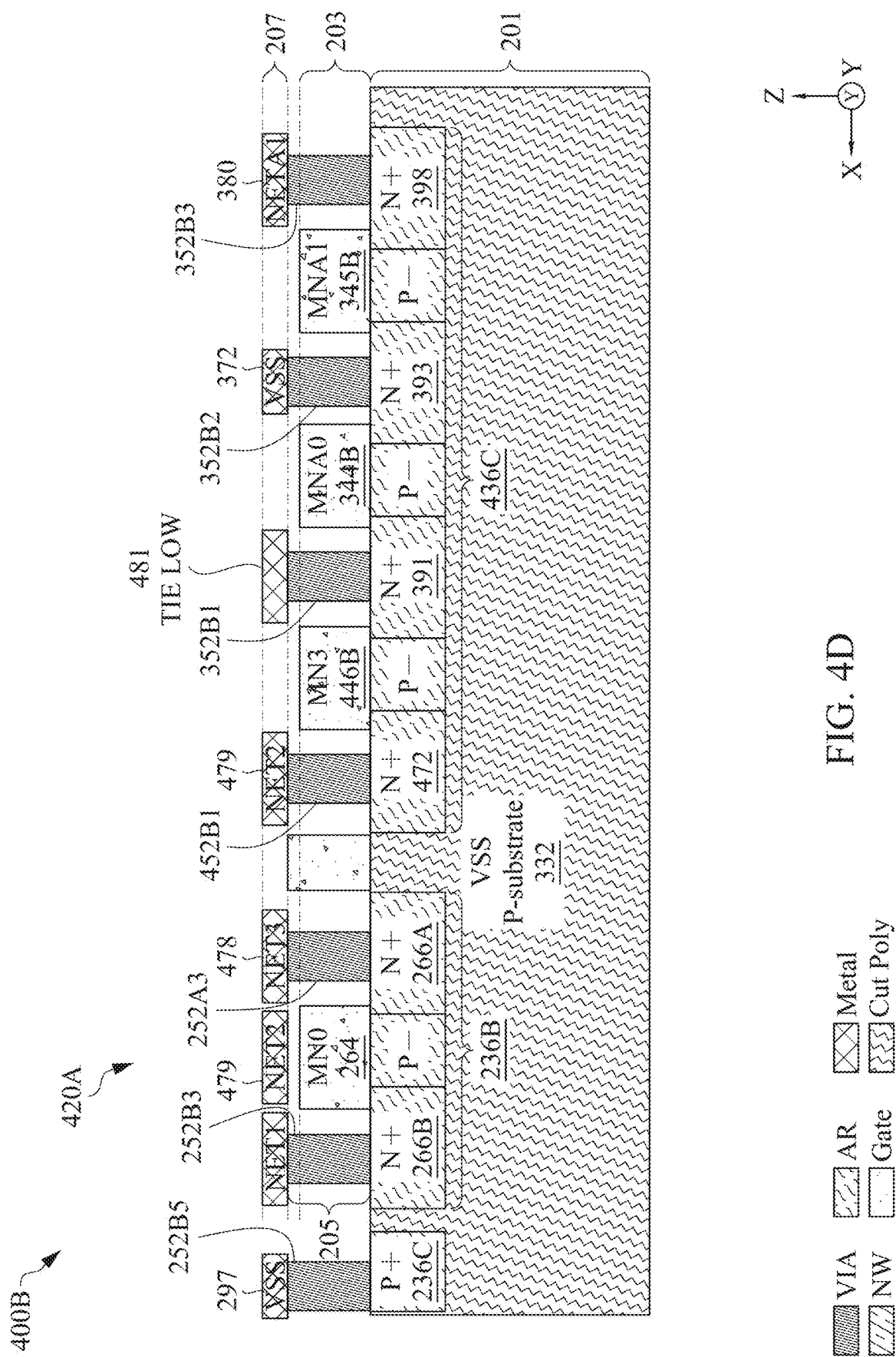

FIGS. 4B-4D are diagrams of an IC 400B, in accordance with some embodiments.

FIG. 4B is top-level view of IC 400B, in accordance with some embodiments.

FIG. 4C is a cross-sectional view of IC 400B as intersected by plane E-E', in accordance with some embodiments.

FIG. 4D is a cross-sectional view of IC 400B as intersected by plane F-F', in accordance with some embodiments.

IC 400B is an embodiment of Schmitt trigger circuit 400A of FIG. 4A, and similar detailed description is therefore omitted.

IC 400B is manufactured based on a corresponding layout design similar to IC 400B. For brevity FIGS. 4B-4D are described as a corresponding IC 400B, but in some embodiments, FIGS. 4B-4D further correspond to layout designs having features similar to IC 400B, and structural elements of IC 400B further correspond to layout patterns, and structural relationships including alignment, lengths and widths, as well as configurations and layers of a corresponding layout design of IC 400B are similar to the structural relationships and configurations and layers of IC 400B, and similar detailed description will not be described for brevity.

For purposes of brevity and succinctness, common reference numerals and elements to the FIGS. 2A-2D, 3A-3D, and 4A-4D retain the same number. Further, discussion on these elements is not presented again to avoid repetition.

Differences between the figures are called out with separate, new reference numerals, and discussion of the differences. Furthermore, similar elements from FIG. 4A correspond to elements in FIGS. 4B-4D with an "A" after the similar reference numeral. For example, circuit 426 in FIG. 4A corresponds to circuit 426A in FIGS. 4B-4D, and circuit 418 in FIG. 4A corresponds to circuit 418A in FIGS. 4B-4D.

IC 400B is a variation of IC 300B of FIGS. 3B-3D, and similar detailed description is therefore omitted. For example, in comparison with IC 300B of FIGS. 3B-3D, IC 400B further includes a circuit 422A and a circuit 423A, and similar detailed description is therefore omitted. IC 400B includes IC 300B and circuits 422A and 423A.

IC 400B is a variation of IC 300B of FIGS. 3B-3D, and similar detailed description is therefore omitted. For example, in comparison with IC 300B of FIGS. 3B-3D, a set of active regions 434 of IC 400B replaces active regions 334 of FIGS. 3B-3D, a set of active regions 436 of IC 400B replaces active regions 336 of FIGS. 3B-3D, a circuit 418A of IC 400B replaces circuit 318A of FIGS. 3B-3D, a circuit 426A of IC 400B replaces circuit 326A of FIGS. 3B-3D, and similar detailed description is therefore omitted.

The set of active regions 436 includes active regions 236A, 236B, 436C and 336D.

Active region 436C replaces active region 336C of IC 300B of FIGS. 3B-3D, and similar detailed description is therefore omitted. Active region 436C is positioned in substrate 332, and is outside of well 330. Each of active regions 236A, 236B, 436C and 336D are separated from each other in the first direction X.

Well 330 includes set of active regions 434. The set of active regions 434 includes active regions 234A, 234B, 434C and 334D. Active region 434C replaces active region 334C of IC 300B of FIGS. 3B-3D, and similar detailed description is therefore omitted. Active region 434C is positioned in well 330. Each of active regions 234A, 234B, 434C and 334D are separated from each other in the first direction X.

Active region 434C corresponds to the active regions of transistors MP3, MPB0 and MPB1 of circuit 426A. Active region 436C corresponds to the active regions of transistors MN3, MNA0 and MNA1 of circuit 418A.

Active region 234B of transistor MP0 is indirectly coupled to power rail 244 by at least transistor MN3 or MNA0. Thus, active region 234B is not directly coupled to power rail 244 thereby reducing the possibility of parasitic PNP transistors in well 330 and abutting circuits from turning on.

Active region 236B of transistor MN0 is indirectly coupled to power rail 242 by at least transistor MP3 or MPB0. Thus, active region 236B is not directly coupled to power rail 242 thereby reducing the possibility of parasitic NPN transistors in substrate 330A and abutting circuits from turning on.

In some embodiments, reduction of PNP and/or NPN parasitic transistors turning on, increases the breakdown voltage of IC 400B resulting in improved ESD performance than other approaches.

Circuit 426A includes at least transistor MP3, MPB0, MPB1 or MNB0. Circuit 418A includes transistor MN3, MNA0, MNA1 or MPA0.

Transistor MN3 is an NMOS transistor including a gate 446B, a S/D 472, and S/D 391. Gate 446B is separated from gate 446A by removed gate portion 386C4. Gate 446B extends in the second direction, and is on the third level. S/D region 472 of transistor MN3, and S/D 391 of transistors MNA0 and MN3 are within active region 436C. In comparison with FIGS. 3B-3D, S/D 391 of IC 400B is the source/drain of each of transistors MNA0 and MN3.

Transistor MP3 is a PMOS transistor including a gate 446A, a S/D 448, and S/D 372. Gate 446A extends in the second direction, and is on the third level. S/D region 448 of transistor MP3, and S/D 372 of transistors MPB0 and MP3 are within active region 434C. In comparison with FIGS. 3B-3D, S/D 372 of IC 400B is the source/drain of each of transistors MPB0 and MP3.

IC 400B further includes vias 452, via 373, via 374, via 376, vias 383-385, via 484 and via 473, and conductive structures 253, 354, 358, 360, 361, 371, 372, 377, 380 and 478-481.

Vias 452, via 373, via 374, via 376, vias 383-385, via 484 or via 473 are similar to vias 252 or 352, and similar detailed description is therefore omitted. Vias 452 include one or more of vias 252A1, 252A3, 352A1-352A5, 352B1, 352B3, 352B1-352B5, 452A1 or 452B1. Vias 452 include other vias shown in FIG. 4B that are not labelled, but are similar to vias 252A1-252A5 or vias 252B1-252B5, and similar detailed description is omitted.

Conductive structures 253, 354, 358, 360, 361, 371, 372, 377, 380 and 478-481 are similar to conductive structures 254, 258, 260 and 278 of FIGS. 2B-2D, and similar detailed description is therefore omitted. In comparison with IC 300B of FIGS. 3B-3D, conductive structures 478-479 of IC 400B replace corresponding conductive structures 378-379 of FIGS. 3B-3D, and similar detailed description is therefore omitted.

Conductive structure 478 connects S/D region 448 of transistor MP3 and S/D region 266A of transistor MN0. Conductive structure 478 is connected to S/D region 448 of transistor MP3 by via 452A1. Conductive structure 478 is connected to S/D region 266A of transistor MN0 by via 252A3.

Conductive structure 479 connects S/D region 472 of transistor MN3 and S/D region 284A of transistor MP0. Conductive structure 479 is connected to S/D region 472 of transistor MN3 by via 452B1. Conductive structure 479 is connected to S/D region 284A of transistor MP0 by via 252A1.

Conductive structure 480 connects gate 446B of transistor MN3, S/D region 372 of transistor MP3, and S/D region 372 of transistor MPB0. Conductive structure 480 is connected to gate 446B of transistor MN3 by via 473. Conductive structure 480 is connected to S/D region 372 of transistor MP3, and S/D region 372 of transistor MPB0 by via 352A1.

Conductive structure 481 connects gate 446A of transistor MP3, S/D region 391 of transistor MN3, and S/D region 391 of transistor MNA0. Conductive structure 481 is connected to gate 446A of transistor MP3 by via 484. Conductive structure 481 is connected to S/D region 391 of transistor MN3, and S/D region 391 of transistor MNA0 by via 352B1.

Transistors MPB0 and MP3 are configured to supply voltage VDD to feedback transistor 220A. Transistors MNA0 and MN3 are configured to supply voltage VSS to feedback transistor 212A. In some embodiments, by configuring transistors MPB0 and MP3 to supply voltage VDD to feedback transistor 220A, and by configuring transistors MNA0 and MN3 to supply voltage VSS to feedback transistor 212A, active regions 236B and 234B of corresponding feedback transistors 220A and 212A are not directly coupled to voltage supplies 204 and 206, thereby causing one or more parasitic PNP or NPN transistors that are part of or next to IC 400B to turn off or remain off during an ESD event at voltage supplies 204 and 206, thereby resulting in IC 400B to have a larger breakdown voltage and better ESD performance than other approaches.

Figure 5A:
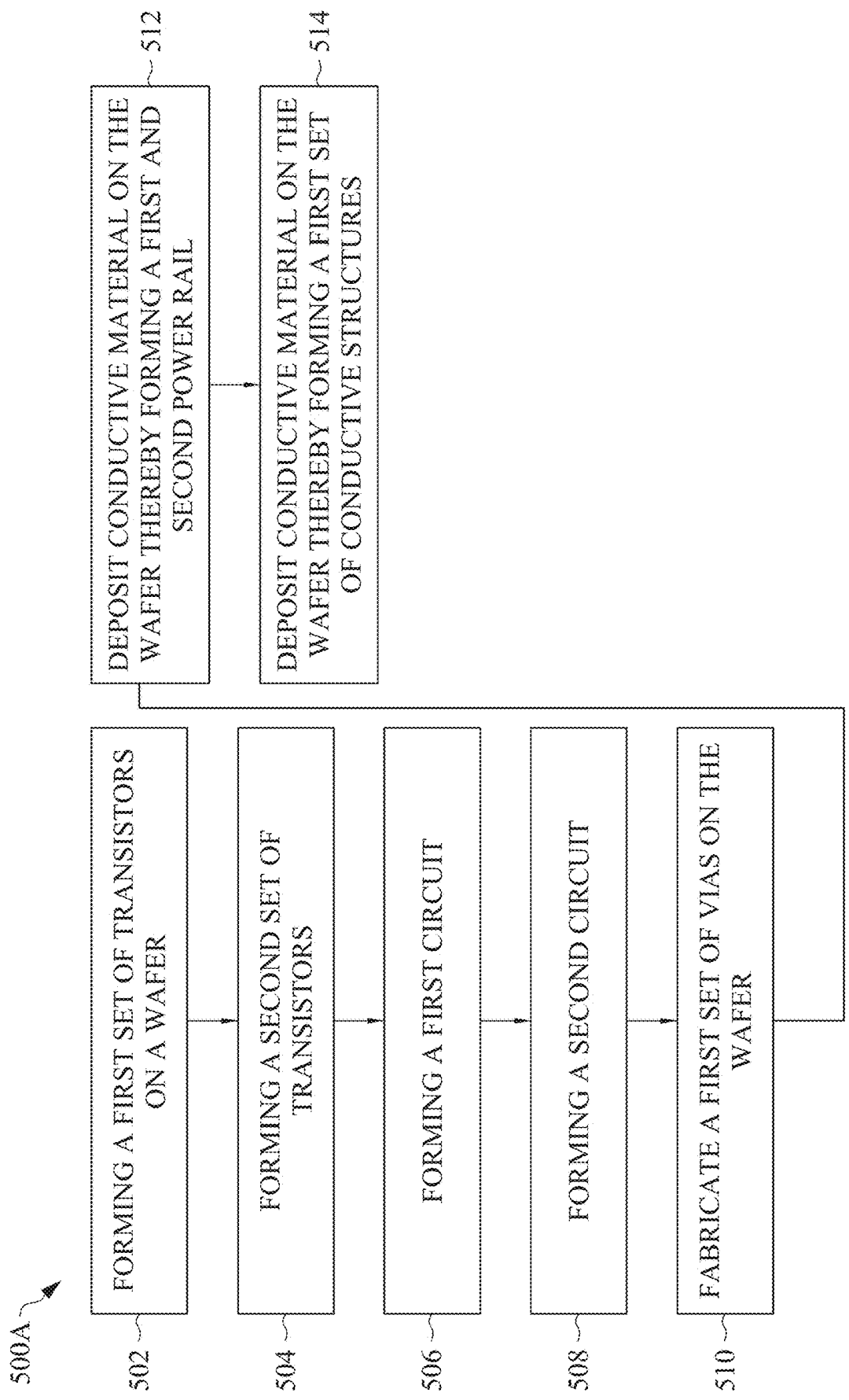
FIG. 5A is a functional flow chart of a method of manufacturing an IC device, in accordance with some embodiments.

FIG. 5A is a functional flow chart of a method 500A of manufacturing an IC device, in accordance with some embodiments. It is understood that additional operations may be performed before, during, and/or after the method 500A depicted in FIG. 5A, and that some other processes may only be briefly described herein.

In some embodiments, other order of operations of methods 500A-700 and 900 is within the scope of the present disclosure. Methods 500A-700 and 900 include exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least methods 500A-700 and 900 is not performed.

In some embodiments, method 500A is an embodiment of operation 604 or 606 of method 600. In some embodiments, the methods 500A-700 and 900 are usable to manufacture or fabricate at least IC 100, 200A-200B, 300A-300B, and 400A-400B.

In some embodiments, other order of operations of methods 500A-700 and 900 are within the scope of the present disclosure. Methods 500A-700 and 900 include exemplary operations, but the operations are not necessarily performed in the order shown. Operations may be added, replaced, changed order, and/or eliminated as appropriate, in accordance with the spirit and scope of disclosed embodiments.

In operation 502 of method 500A, a first set of transistors are fabricated on a semiconductor wafer or substrate (232, 332). In some embodiments, the first set of transistors of method 500A include a first set of active regions that are formed in a first well (well 230, 330) in the substrate. In some embodiments, the first set of transistors of method 500A includes one or more transistors in the set of active regions 234, 334, or 434. In some embodiments, the first set of transistors of method 500A include at least transistors MP2, MP1, or MP0. In some embodiments, the set of transistors of method 500A includes one or more transistors described herein.

In operation 504 of method 500A, a second set of transistors are fabricated on the semiconductor wafer or substrate. In some embodiments, the second set of transistors of method 500A include a second set of active regions that are formed in the substrate. In some embodiments, the second set of transistors of method 500A includes one or more transistors in the set of active regions 236, 336 or 436. In some embodiments, the second set of transistors of method 500A include at least transistors MN2, MN1, or MN0. In some embodiments, the second set of transistors of method 500A includes one or more transistors described herein.

In operation 506 of method 500A, a first circuit is formed on the semiconductor wafer or substrate. In some embodiments, the first circuit of method 500A includes a third set of active regions formed within the first well. In some embodiments, the third set of active regions of method 500A includes active regions 240A, 334C, 334D or 434C. In some embodiments, the first circuit of method 500A includes circuit 218, 218A, 318, 318A, 418 or 418A. The first circuit is configured to supply a first voltage (VDD or VSS) to at least one transistor in the second set of transistors.

In operation 508 of method 500A, a second circuit is formed on the semiconductor wafer or substrate. In some embodiments, the second circuit of method 500A includes a fourth set of active regions formed in the substrate or wafer. In some embodiments, the fourth set of active regions of method 500A includes active regions 238A, 336C, 336D or 436C. In some embodiments, the second circuit of method 500A includes circuit 226, 226A, 326, 326A, 426 or 426A. The second circuit is configured to supply a second voltage (VSS or VDD) to at least one transistor in the first set of transistors. In some embodiments, the fourth set of active regions is outside of the first well.

In some embodiments, one or more of operations 502, 504, 506 and 508 further include fabricating source and drain regions of the set of transistors in the first, second, third or fourth set of active regions. In some embodiments, the substrate comprises p-type dopants. In some embodiments, the p-dopants include boron, aluminum or other suitable p-type dopants. In some embodiments, the first well includes at least well 230 or 330. In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^2$ to about $1 \times 10^{14}$ atoms/cm$^2$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, one or more of operations 502, 504, 506 and 508 further include forming contacts of the first set of transistors, the second set of transistors, the first circuit or the second circuit.

In some embodiments, one or more of operations 502, 504, 506 and 508 further include forming one or more gates of the first set of transistors, the second set of transistors, the first circuit or the second circuit. In some embodiments, the one or more gates of method 500A include one or more of gates 246A-246B, 264, 344A-344B, 345A-345B, 386A-386B or 446A-446B.

In some embodiments, the one or more gates of method 500A is between the drain and the source region. In some embodiments, the gate is over the first well and the substrate. In some embodiments, fabricating the gate regions of method 500A includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 512 of method 500A, a conductive material is deposited on the wafer or substrate on a second level (e.g., M0, M1, M2, M3, etc.) of the integrated circuit thereby forming at least a first power rail or a second power rail. In some embodiments, the first power rail of method 500A includes one or more of power rail 242 or 244. In some embodiments, the second power rail of method 500A includes one or more of power rail 244 or 242. In some embodiments, the first power rail or second power rail of method 500A includes one or more conductors in the "METAL layer" of FIGS. 2B-2D, 3B-3D or 4B-4D.

In operation 514 of method 500A, a conductive material is deposited on the wafer or substrate on the second level (e.g., M0, M1, M2, M3, etc.) of the integrated circuit thereby forming a first set of conductive structures. In some embodiments, the first set of conductive structures of method 500A includes at least conductive structures 253, 254, 258, 260 or 278, conductive structures 354, 358, 360, 361, 371, 372 or 377-380, or conductive structures 478-481. In some embodiments, the first set of conductive structures of method 500A includes one or more conductors in the "METAL layer" of FIGS. 2B-2D, 3B-3D or 4B-4D.

In some embodiments, one or more of operations 502, 504, 506, 508, 510 or 512 of method 500A include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 9:
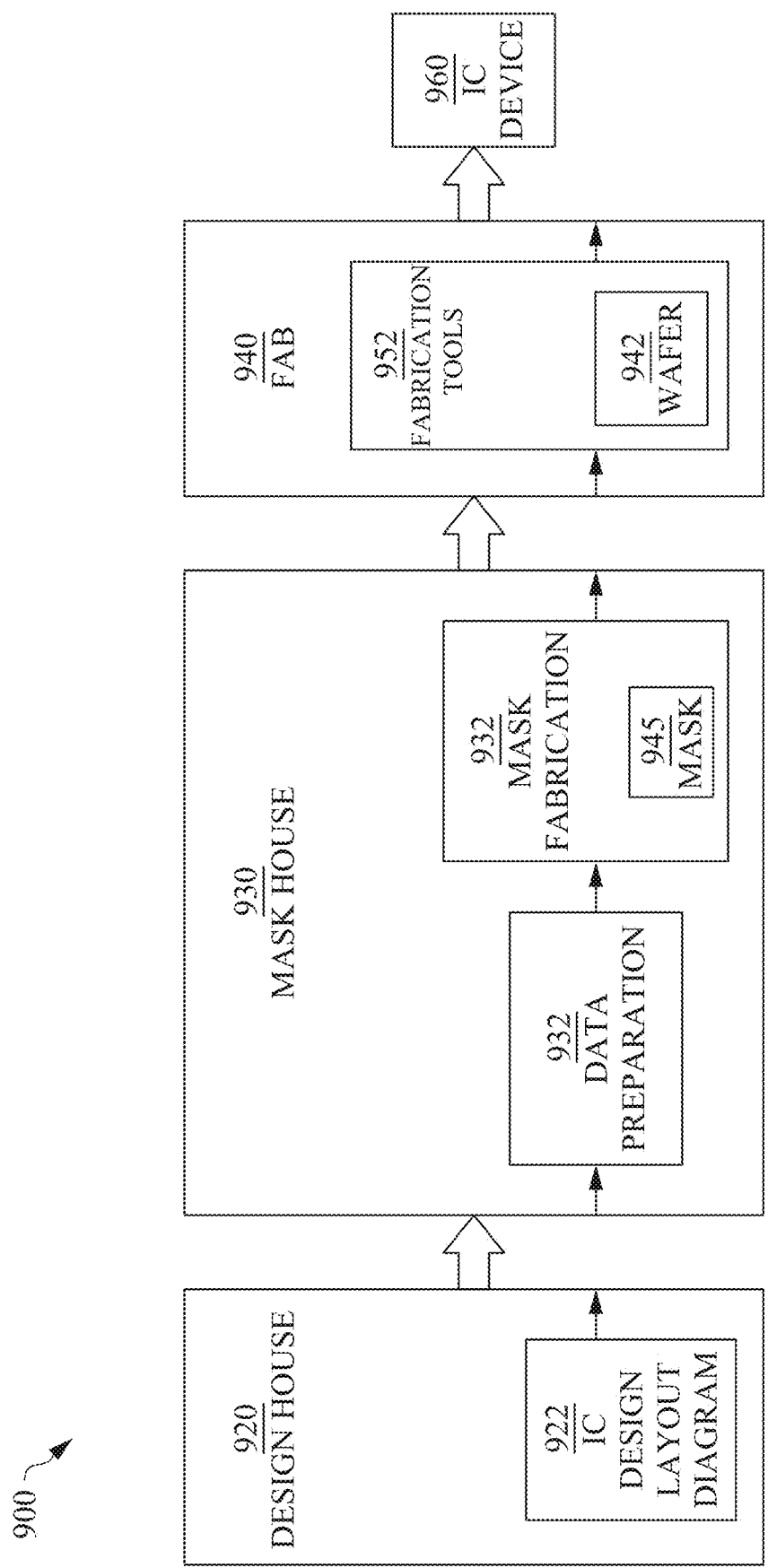
FIG. 9 is a block diagram of an IC manufacturing system, and an IC manufacturing flow associated therewith, in accordance with at least one embodiment of the present disclosure.

In some embodiments, at least one or more operations of method 500A is performed by system 900 of FIG. 9. In some embodiments, at least one method(s), such as method 500A discussed above, is performed in whole or in part by at least one manufacturing system, including system 900. One or more of the operations of method 500A is performed by IC fab 940 (FIG. 9) to fabricate IC device 960. In some embodiments, one or more of the operations of method 500A is performed by fabrication tools 952 to fabricate wafer 942.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 502, 504, 506, 508, 510, 512 or 514, the conductive material is planarized to supply a level surface for subsequent steps.

In some embodiments, one or more of the operations of method 500A, 500B, 600, 700 or 900 are not performed.

One or more of the operations of methods 500A-700 and 900 are performed by a processing device configured to execute instructions for manufacturing an integrated circuit, such as at least IC 100, 200A-200B, 300A-300B, and 400A-400B. In some embodiments, one or more operations of methods 500A-700 and 900 is performed using a same processing device as that used in a different one or more operations of methods 500A-700 and 900. In some embodiments, a different processing device is used to perform one or more operations of methods 500A-700 and 900 from that used to perform a different one or more operations of methods 500A-700 and 900. In some embodiments, other order of operations of method 500A-700 and 900 is within the scope of the present disclosure. Method 500A-700 and 900 includes exemplary operations, but the operations are not necessarily performed in the order shown. Operations in method 500A-700 and 900 may be added, replaced, changed order, and/or eliminated as appropriate, in accordance with the spirit and scope of disclosed embodiments.

Figure 5B:
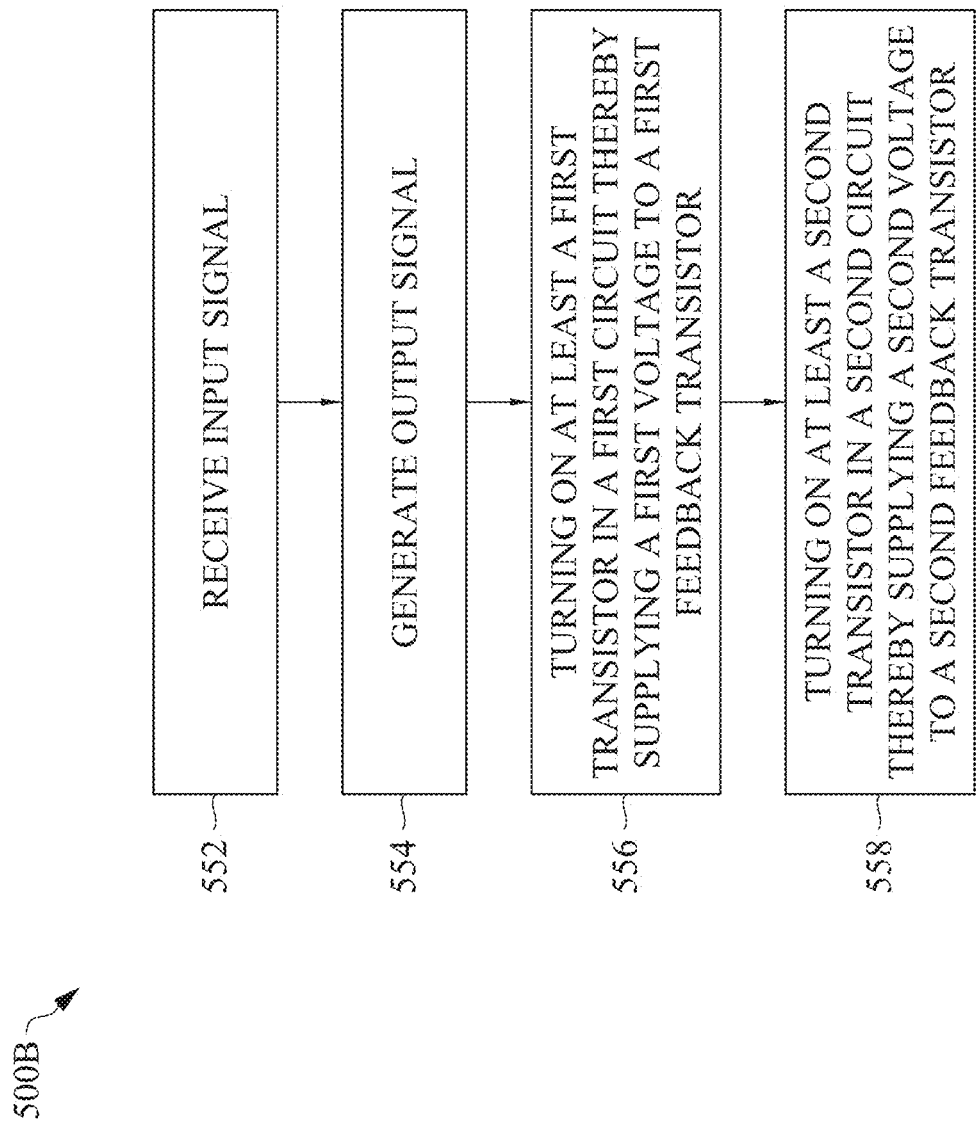
FIG. 5B is a flowchart of a method of operating an IC in accordance with some embodiments.

FIG. 5B is a flowchart of a method 500B of operating an IC, in accordance with some embodiments.

In some embodiments, the IC of method 500B includes one or more of IC 100 or Schmitt trigger circuit 200A, 300A or 400A. It is understood that method 500B utilizes features of one or more of IC 100 or Schmitt trigger circuit 200A, 300A or 400A.

In operation 552 of method 500B, an input signal IN is received by an IC. In some embodiments, the IC of method 500B includes IC 100 or Schmitt trigger circuit 200A, 300A or 400A.

In operation 554 of method 500B, an output signal OUT is generated by the IC.

In operation 556 of method 500B, at least a first transistor in a first circuit of the IC is turned on thereby supplying a first voltage to a first feedback transistor (transistor MP0) of the IC. In some embodiments, the first circuit of the IC of method 500B includes circuit 218, 218A, 318, 318A, 418 or 418A. In some embodiments, the first transistor in the first circuit of the IC of method 500B includes transistor MN3, MNA0, MPA0 or MNA1. In some embodiments, the first supply voltage of method 500B is voltage VDD.

In operation 558 of method 500B, at least a second transistor in a second circuit of the IC is turned on thereby supplying a second voltage to a second feedback transistor (transistor MN0) of the IC. In some embodiments, the second circuit of the IC of method 500B includes circuit 226, 226A, 326, 326A, 426 or 426A. In some embodiments, the second transistor in the second circuit of the IC of method 500B includes transistor MP3, MPB0, MNB0 or MPB1. In some embodiments, the second supply voltage of method 500B is voltage VSS.

Figure 6:
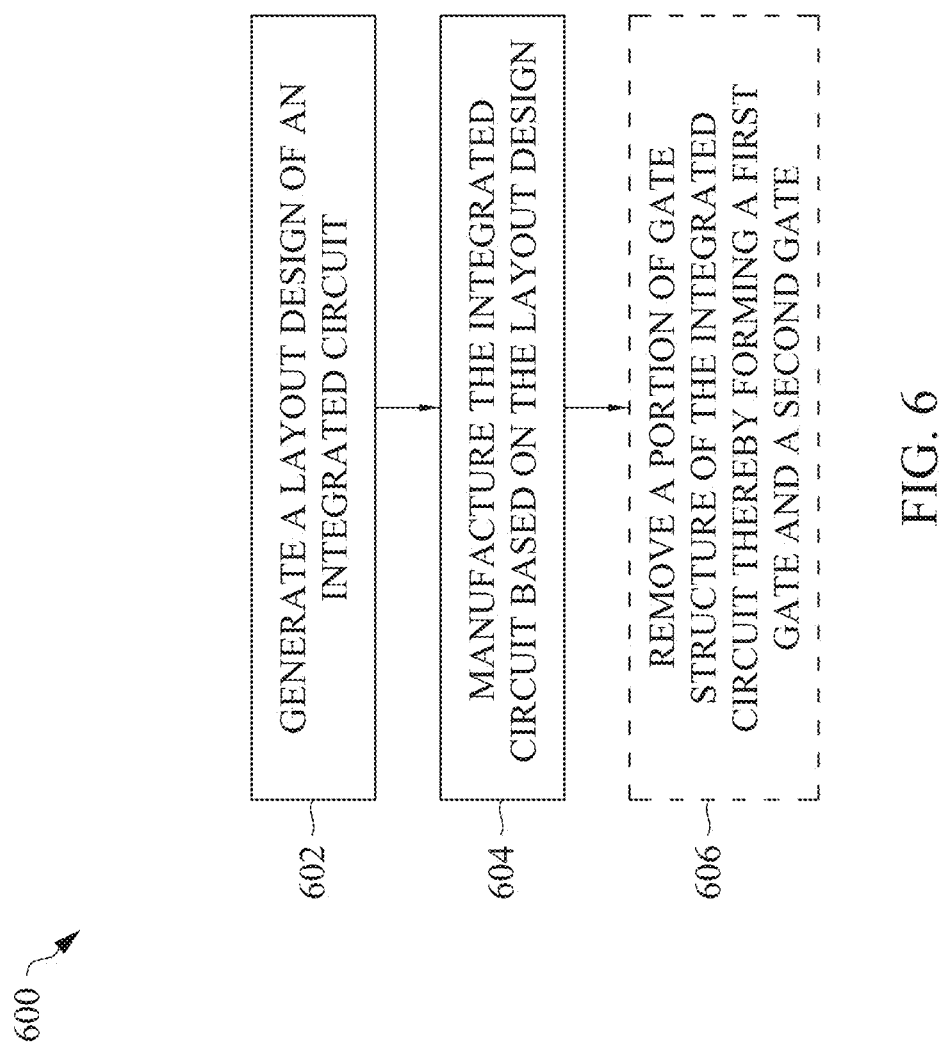
FIG. 6 is a flowchart of a method of forming or manufacturing an integrated circuit in accordance with some embodiments.

FIG. 6 is a flowchart of a method 600 of forming or manufacturing an integrated circuit in accordance with some embodiments. It is understood that additional operations may be performed before, during, and/or after the method 600 depicted in FIG. 6, and that some other operations may only be briefly described herein. In some embodiments, the method 600 is usable to form integrated circuits, such as at least IC 100, 200A-200B, 300A-300B, and 400A-400B. In some embodiments, the method 600 is usable to form integrated circuits having similar features and similar structural relationships as one or more of IC 200B, 300B or 400B shown in FIGS. 2B, 3B, and 4B.

In operation 602 of method 600, a layout design of an integrated circuit is generated. Operation 602 is performed by a processing device (e.g., processor 802 (FIG. 8)) configured to execute instructions for generating a layout design. In some embodiments, the layout design of method 600 includes one or more patterns of a layout design similar to at least integrated circuit 200B, 300B or 400B, or one or more features similar to at least IC 100, 200A, 300A, and 400A. In some embodiments, the layout design of the present application is in a graphic database system (GDSII) file format.

In operation 604 of method 600, the integrated circuit is manufactured based on the layout design. In some embodiments, operation 604 of method 600 comprises manufacturing at least one mask based on the layout design, and manufacturing the integrated circuit based on the at least one mask. In some embodiments, operation 604 corresponds to method 500A of FIG. 5A.

In operation 606 of method 600, a portion, such as removed gate portion 246 or 386, is removed thereby forming a first gate 246A and a second gate 246B. In some embodiments, the removed portion of the gate structure corresponds to a cut region (e.g., set of cut feature layout patterns 246C and 386C (FIGS. 2B-3B)). In some embodiments, the operation is referred to as a poly-cut (CPO) process.

In some embodiments, the portion of the gate structure that is removed is identified in a layout design as set of cut feature layout patterns.

In some embodiments, removal operation is performed by a removal process. In some embodiments, the removal process includes one or more etching processes suitable to remove a portion of the gate structure. In some embodiments, the etching process includes identifying a portion of the gate structure that is to be removed, and etching the portion of the gate structure that is to be removed. In some embodiments, a mask is used to specify portions of the structure that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

In some embodiments, operation 604 or 606 of method 600 is useable to manufacture one or more integrated circuits having one or more of the advantages described herein, and similar detailed description is therefore omitted. In some embodiments, operation 606 is not performed.

Figure 7:
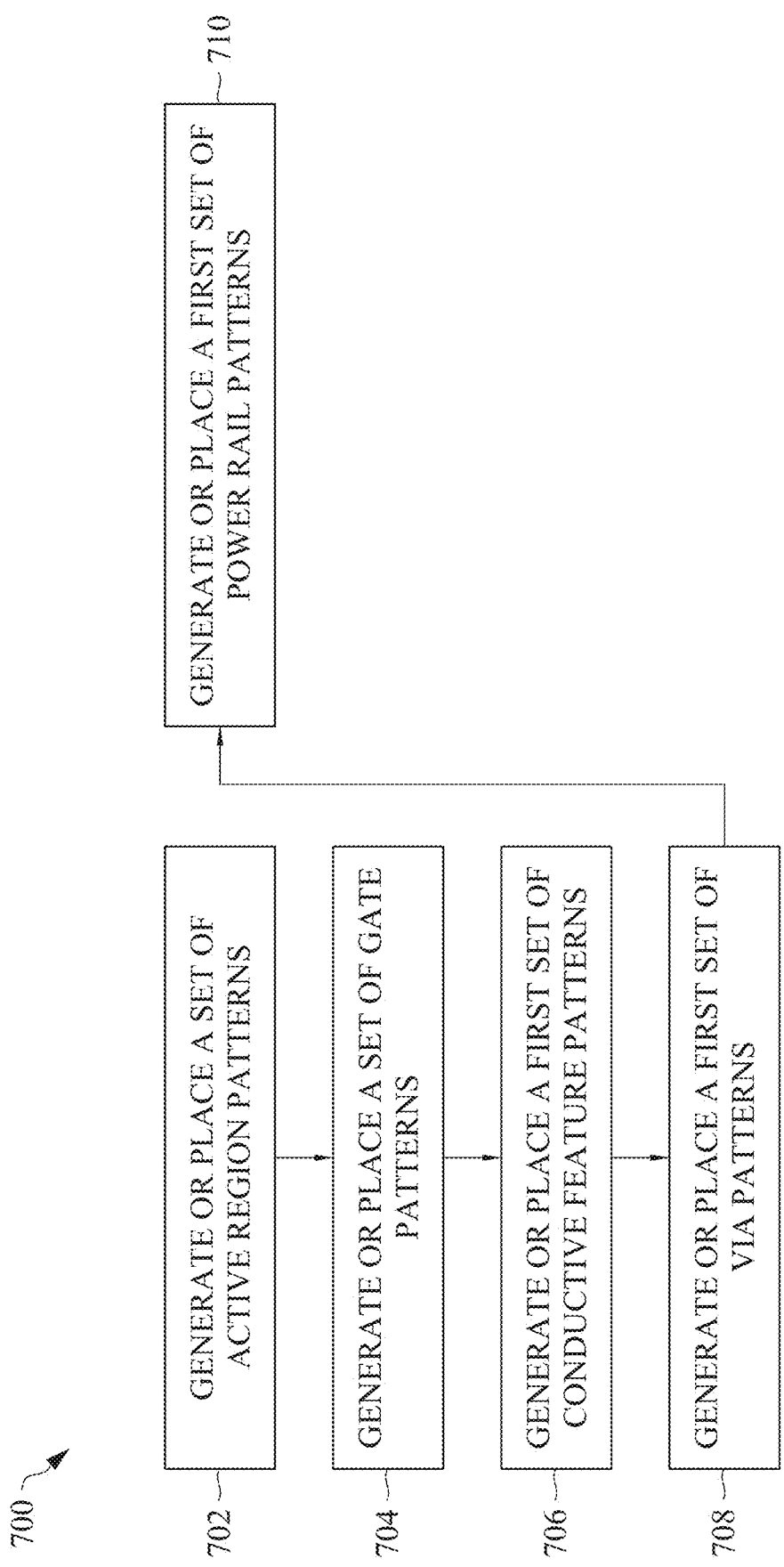
FIG. 7 is a flowchart of a method of generating a layout design of an integrated circuit, in accordance with some embodiments.

FIG. 7 is a flowchart of a method 700 of generating a layout design of an integrated circuit, in accordance with some embodiments. It is understood that additional operations may be performed before, during, and/or after the method 700 depicted in FIG. 7, and that some other processes may only be briefly described herein. In some embodiments, method 700 is usable to generate one or more layout designs having layout patterns that are similar to corresponding structural features in at least IC 100, 200A-200B, 300A-300B or 400A-400B.

In some embodiments, method 700 is usable to generate one or more layout patterns similar to one or more corresponding structural features in at least IC 100, 200A-200B, 300A-300B or 400A-400B. In some embodiments, method 700 is usable to generate one or more layout patterns having pattern relationships that are similar to one or more structural relationships including at least positions, alignment, lengths or widths, as well as configurations and layers of at least IC 100, 200A-200B, 300A-300B or 400A-400B, and similar detailed description will not be described in FIG. 7, for brevity.

In operation 702 of method 700, a set of active region patterns is generated or placed on the layout design. In some embodiments, the set of active region patterns of method 700 includes one or more active region patterns similar to at least the set of active regions 234, 236, 334, 336, 434, 436 or at least active region 238A or 240A, of non-limiting examples of FIGS. 2B-2D, 3B-3D or 4B-4D.

In operation 704 of method 700, a set of gate patterns is generated or placed on the layout design. In some embodiments, the set of gate patterns of method 700 includes one or more gate layout patterns similar to at least gate 246A-246B, 264, 344A-344B, 345A-345B, 386A-386B or 446A-446B, of non-limiting examples of FIGS. 2B-2D, 3B-3D or 4B-4D.

In operation 706 of method 700, a first set of conductive feature patterns is generated or placed on the layout design. In some embodiments, the first set of conductive feature patterns of method 700 includes one or more conductive feature patterns similar to at least conductive structures 253, 254, 258, 260 or 278, conductive structures 354, 358, 360, 361, 371, 372 or 377-380, or conductive structures 478-481, of non-limiting examples of FIGS. 2B-2D, 3B-3D or 4B-4D.

In operation 708 of method 700, a first set of via patterns is generated or placed on the layout design. In some embodiments, the first set of via patterns of method 700 includes one or more via patterns similar to at least vias 252, via 274, via 276, vias 352, via 373, via 374, via 376, vias 383-385, vias 452, via 484 or via 473, of non-limiting examples of FIGS. 2B-2D, 3B-3D or 4B-4D.

In operation 710 of method 700, a first set of power rail patterns is generated or placed on the layout design. In some embodiments, the first set of power rail patterns of method 700 includes one or more power rail layout patterns similar to at least power rail 242 or 244, of non-limiting examples of FIGS. 2B-2D, 3B-3D or 4B-4D.

Figure 8:
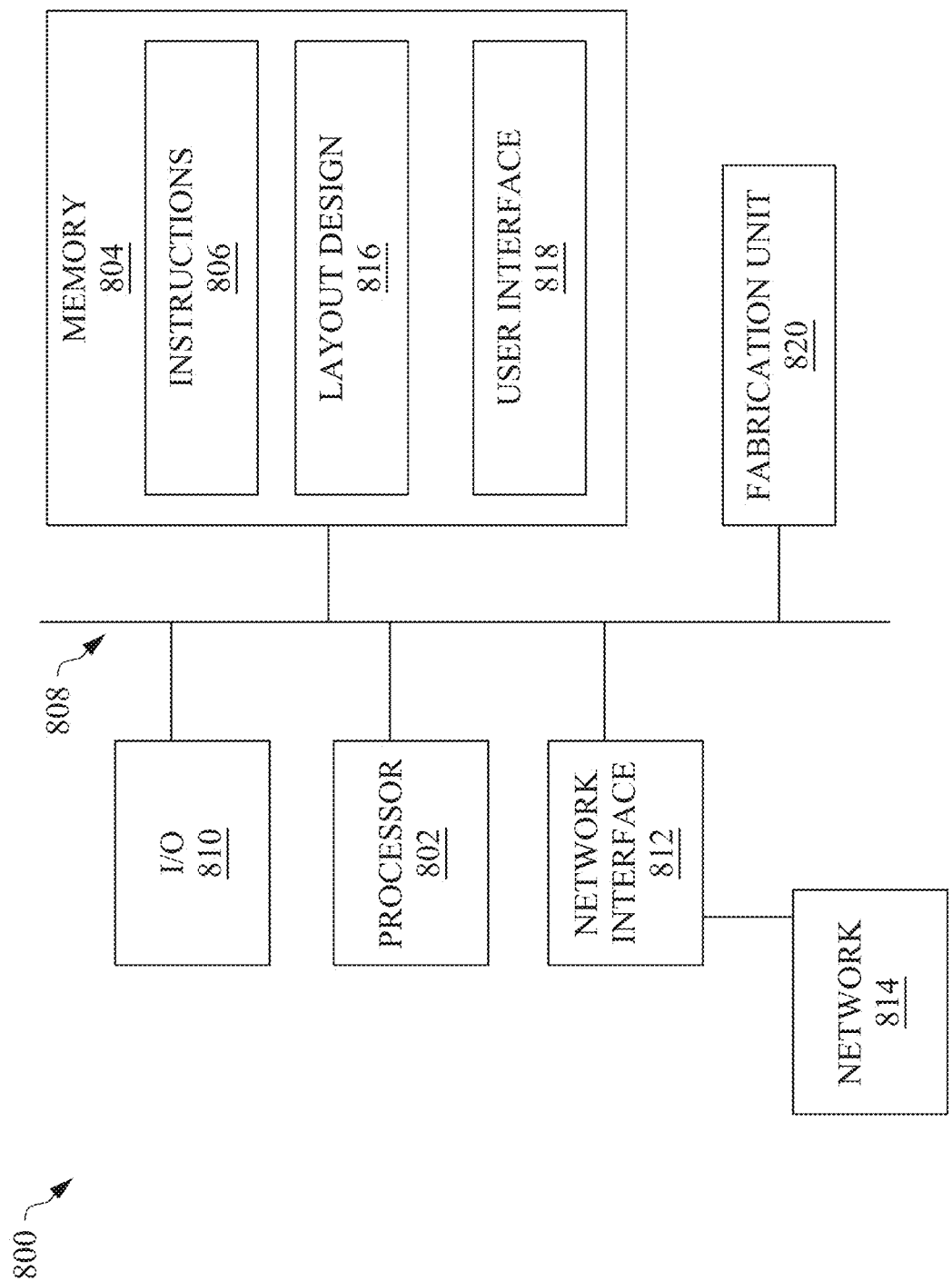
FIG. 8 is a schematic view of a system for designing an IC layout design and manufacturing an IC circuit, in accordance with some embodiments.

FIG. 8 is a schematic view of a system 800 for designing an IC layout design and manufacturing an IC circuit, in accordance with some embodiments.

In some embodiments, system 800 generates or places one or more IC layout designs described herein. System 800 includes a hardware processor 802 and a non-transitory, computer readable storage medium 804 (e.g., memory 804) encoded with, i.e., storing, the computer program code 806, i.e., a set of executable instructions 806. Computer readable storage medium 804 is configured for interfacing with manufacturing machines for producing the integrated circuit. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described in method 600-700.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform method 600-700. In some embodiments, the storage medium 804 also stores information needed for performing method 600-700 as well as information generated during performing method 600-700, such as layout design 816, user interface 818 and fabrication unit 820, and/or a set of executable instructions to perform the operation of method 600-700. In some embodiments, layout design 816 comprises one or more layout patterns that are similar to features of at least integrated circuit 200B, 300B or 400B.

In some embodiments, the storage medium 804 stores instructions (e.g., computer program code 806) for interfacing with manufacturing machines. The instructions (e.g., computer program code 806) enable processor 802 to generate manufacturing instructions readable by the manufacturing machines to effectively implement method 600-700 during a manufacturing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-2094. In some embodiments, method 600-700 is implemented in two or more systems 800, and information such as layout design, and user interface are exchanged between different systems 800 by network 814.

System 800 is configured to receive information related to a layout design through I/O interface 810 or network interface 812. The information is transferred to processor 802 by bus 808 to determine a layout design for producing at least integrated circuit 300, 400, 700, 800, 1100 or 1200. The layout design is then stored in computer readable medium 804 as layout design 816. System 800 is configured to receive information related to a user interface through I/O interface 810 or network interface 812. The information is stored in computer readable medium 804 as user interface 818. System 800 is configured to receive information related to a fabrication unit 820 through I/O interface 810 or network interface 812. The information is stored in computer readable medium 804 as fabrication unit 820. In some embodiments, the fabrication unit 820 includes fabrication information utilized by system 800. In some embodiments, the fabrication unit 820 corresponds to mask fabrication 934 of FIG. 9.

In some embodiments, method 600-700 is implemented as a standalone software application for execution by a processor. In some embodiments, method 600-700 is implemented as a software application that is a part of an additional software application. In some embodiments, method 600-700 is implemented as a plug-in to a software application. In some embodiments, method 600-700 is implemented as a software application that is a portion of an EDA tool. In some embodiments, method 600-700 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 600-700 is implemented by a manufacturing device to manufacture an integrated circuit using a set of masks manufactured based on one or more layout designs generated by system 800. In some embodiments, system 800 is a manufacturing device configured to manufacture an integrated circuit using a set of masks manufactured based on one or more layout designs of the present disclosure. In some embodiments, system 800 of FIG. 8 generates layout designs of an integrated circuit that are smaller than other approaches. In some embodiments, system 800 of FIG. 8 generates layout designs of integrated circuit structure that occupy less area and provide better routing resources than other approaches.

FIG. 9 is a block diagram of an integrated circuit (IC) manufacturing system 900, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 (hereinafter "system 900") includes entities, such as a design house 920, a mask house 930, and an IC manufacturer/fabricator ("fab") 940, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 920, mask house 930, and IC fab 940 is owned by a single larger company. In some embodiments, one or more of design house 920, mask house 930, and IC fab 940 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout 922. The design procedure includes one or more of logic design, physical design or place and route. IC design layout 922 is presented in one or more data files having information of the geometrical patterns. For example, IC design layout 922 can be expressed in a GDSII file format or DFII file format.

Mask house 930 includes data preparation 932 and mask fabrication 934. Mask house 930 uses IC design layout 922 to manufacture one or more masks 945 to be used for fabricating the various layers of IC device 960 according to IC design layout 922. Mask house 930 performs mask data preparation 932, where IC design layout 922 is translated into a representative data file (RDF). Mask data preparation 932 provides the RDF to mask fabrication 934. Mask fabrication 934 includes a mask writer. A mask writer converts the RDF to an image on a substrate, such as a mask (reticle) 945 or a semiconductor wafer 942. The design layout 922 is manipulated by mask data preparation 932 to comply with particular characteristics of the mask writer and/or requirements of IC fab 940. In FIG. 9, mask data preparation 932 and mask fabrication 934 are illustrated as separate elements. In some embodiments, mask data preparation 932 and mask fabrication 934 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 940 to fabricate IC device 960. LPC simulates this processing based on IC design layout 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 922.

It should be understood that the above description of mask data preparation 932 has been simplified for the purposes of clarity. In some embodiments, data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 945 or a group of masks 945 are fabricated based on the modified IC design layout 922. In some embodiments, mask fabrication 934 includes performing one or more lithographic exposures based on IC design 922. In some embodiments, an electron-beam (e-beam) or a mechanism of multiple e-beams is used to form a pattern on a mask (photomask or reticle) 945 based on the modified IC design layout 922. The mask 945 can be formed in various technologies. In some embodiments, the mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 945 includes a transparent substrate (e.g., fused quartz) and an opaque material (e.g., chromium) coated in the opaque regions of the binary mask. In another example, the mask 945 is formed using a phase shift technology. In the phase shift mask (PSM) version of mask 945, various features in the pattern formed on the mask are configured to have proper phase difference to enhance the resolution and imaging quality. In various examples, the phase shift mask can be attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 940 is an IC fabrication entity that includes one or more manufacturing facilities for the fabrication of a variety of different IC products. In some embodiments, IC Fab 940 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 940 includes wafer fabrication tools 952 (hereinafter fabrication tools 952) configured to execute various manufacturing operations on semiconductor wafer 942 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 940 uses mask(s) 945 fabricated by mask house 930 to fabricate IC device 960. Thus, IC fab 940 at least indirectly uses IC design layout 922 to fabricate IC device 960. In some embodiments, a semiconductor wafer 942 is fabricated by IC fab 940 using mask(s) 945 to form IC device 960. In some embodiments, the IC fabrication includes performing one or more lithographic exposures based at least indirectly on IC design 922. Semiconductor wafer 942 includes a silicon substrate or other proper substrate having material layers formed thereon. Semiconductor wafer 942 further includes one or more of various doped regions, dielectric features, multilevel interconnects, and the like (formed at subsequent manufacturing steps).

System 900 is shown as having design house 920, mask house 930 or IC fab 940 as separate components or entities. However, it is understood that one or more of design house 920, mask house 930 or IC fab 940 are part of the same component or entity.

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, an integrated circuit includes a Schmitt trigger circuit. In some embodiments, the Schmitt trigger circuit includes a first and second set of transistors, a first and second feedback transistor, and a first and second circuit. In some embodiments, the first set of transistors is connected between a first voltage supply and an output node. The first voltage supply having a first voltage. In some embodiments, the second set of transistors is connected between the output node and a second voltage supply different from the first voltage supply. In some embodiments, the second voltage supply has a second voltage different from the first voltage. In some embodiments, the first feedback transistor is connected to the output node, a first node between the first set of transistors, and a second node. In some embodiments, the first circuit is electrically connected to the second node, the first voltage supply and the second voltage supply, and is configured to supply the second supply voltage to the second node. In some embodiments, the second feedback transistor is connected to the output node, a third node between the second set of transistors, and a fourth node. In some embodiments, the second circuit is electrically connected to the fourth node, the first voltage supply and the second voltage supply, and configured to supply the first supply voltage to the fourth node.

Another aspect of this description relates to an integrated circuit. In some embodiments, the integrated circuit includes a Schmitt trigger circuit. In some embodiments, the Schmitt trigger circuit includes a first transistor connected between a first voltage supply and a first node, the first voltage supply having a first supply voltage. In some embodiments, the Schmitt trigger circuit further includes a second transistor connected between the first node and an output node. In some embodiments, the Schmitt trigger circuit further includes a third transistor connected to at least the output node. In some embodiments, the Schmitt trigger circuit further includes a fourth transistor connected between the third transistor and a second voltage supply different from the first voltage supply, the second voltage supply having a second supply voltage different from the first supply voltage. In some embodiments, the Schmitt trigger circuit further includes a first feedback transistor connected to the output node, a first node, and a second node. In some embodiments, the Schmitt trigger circuit further includes a first circuit connected to the second node, the first voltage supply and the second voltage supply, and configured to supply the second supply voltage to the second node in response to being enabled. In some embodiments, the Schmitt trigger circuit further includes a second feedback transistor connected to the output node, a third node, and a fourth node, the third node being between the third transistor and the fourth transistor. In some embodiments, the Schmitt trigger circuit further includes a second circuit connected to the fourth node, the first voltage supply and the second voltage supply, and configured to supply the first supply voltage to the fourth node in response to being enabled.

Still another aspect of this description relates to a method of fabricating an integrated circuit. In some embodiments, the method includes forming a first set of transistors on a substrate, the first set of transistors including a first set of active regions in a first well in the substrate. In some embodiments, the method further includes forming a second set of transistors, the second set of transistors including a second set of active regions in the substrate. In some embodiments, the method further includes forming a first circuit, the first circuit including a third set of active regions within the first well, the first circuit being configured to supply a first voltage to at least one transistor in the second set of transistors. In some embodiments, the method further includes forming a second circuit, the second circuit including a fourth set of active regions in the substrate, the second circuit configured to supply a second voltage to at least one transistor in the first set of transistors. In some embodiments, the method further includes depositing a first conductive material on a first level over at least the first circuit or second circuit thereby forming a first power rail, the first power rail being configured to supply the first voltage to at least the first circuit. In some embodiments, the method further includes depositing a second conductive material on the first level thereby forming a second power rail, the second power rail being configured to supply the second voltage to at least the second circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a Schmitt trigger circuit, comprising:
        a first set of transistors connected between a first voltage supply and an output node, the first voltage supply having a first supply voltage;
        a second set of transistors connected between the output node and a second voltage supply different from the first voltage supply, the second voltage supply having a second supply voltage different from the first supply voltage;
        a first feedback transistor connected to the output node, a first node between the first set of transistors, and a second node;
        a first circuit electrically connected to the second node, the first voltage supply and the second voltage supply, and configured to supply the second supply voltage to the second node;
        a second feedback transistor connected to the output node, a third node between the second set of transistors, and a fourth node; and
        a second circuit electrically connected to the fourth node, the first voltage supply and the second voltage supply, and configured to supply the first supply voltage to the fourth node; and
    a gate grounded NMOS (GGNMOS) transistor connected between the first voltage supply and the second voltage supply, and being in parallel with the Schmitt Trigger circuit.

2. The integrated circuit of claim 1, wherein
the first circuit comprises:
    a first NMOS transistor including a first gate connected to the first voltage supply, a first source/drain (S/D) and a first transistor body connected to the second voltage supply, and a second S/D connected to at least the second node; and
the second circuit comprises:
    a first PMOS transistor including a second gate connected to the second voltage supply, a third S/D and a second transistor body connected to the first voltage supply, and a fourth S/D connected to at least the fourth node.

3. The integrated circuit of claim 2, wherein the first feedback transistor comprises:
    a second PMOS transistor including a third gate connected to at least the output node, a fifth S/D connected to the first node, a third transistor body connected to the first voltage supply, and a sixth S/D connected to the second node and the second S/D.

4. The integrated circuit of claim 3, wherein the second feedback transistor comprises:
    a second NMOS transistor including a fourth gate connected to the output node and the third gate, a seventh source/drain connected to the third node, a fourth transistor body connected to the second voltage supply, and an eighth S/D connected to the fourth node and the third S/D.

5. The integrated circuit of claim 1, wherein the first circuit comprises:
    a first PMOS transistor including a first source/drain (S/D) of the first PMOS transistor and a transistor body of the first PMOS transistor connected to the first voltage supply, the first PMOS transistor further including a gate of the first PMOS transistor and a second S/D of the first PMOS transistor;
    a first NMOS transistor including a first S/D of the first NMOS transistor and a transistor body of the first NMOS transistor connected to the second voltage supply, the first NMOS transistor further including a second S/D of the first NMOS transistor and a gate of the first NMOS transistor connected to the gate of the first PMOS transistor; and
    a second NMOS transistor including a first S/D of the second NMOS transistor and a transistor body of the second NMOS transistor connected to the second voltage supply, the second NMOS transistor further including a gate of the second NMOS transistor connected to the second S/D of the first PMOS transistor, and a second S/D of the second NMOS transistor connected to the second node.

6. The integrated circuit of claim 5, wherein the second circuit comprises:
    a third NMOS transistor including a first S/D of the third NMOS transistor and a transistor body of the third NMOS transistor connected to the second voltage supply, the third NMOS transistor further including a gate of the third NMOS transistor and a second S/D of the third NMOS transistor;
    a second PMOS transistor including a first S/D of the second PMOS transistor and a transistor body of the second PMOS transistor connected to the first voltage supply, the second PMOS transistor further including a second S/D of the second PMOS transistor and a gate of the second PMOS transistor connected to the gate of the third NMOS transistor; and
    a third PMOS transistor including a first S/D of the third PMOS transistor and a transistor body of the third PMOS transistor connected to the first voltage supply, the third PMOS transistor further including a gate of the third PMOS transistor connected to the second S/D of the third NMOS transistor, and a second S/D of the third PMOS transistor connected to the fourth node.

7. The integrated circuit of claim 1, wherein
the first circuit comprises:
    a third circuit coupled to at least the first voltage supply and the second voltage supply, and configured to supply the second supply voltage to a fifth node;
the second circuit comprises:
    a fourth circuit coupled to at least the first voltage supply and the second voltage supply, and configured to supply the first supply voltage to a sixth node;
the first circuit further comprises:
    a first NMOS transistor including a first gate of the first NMOS transistor connected to the fourth circuit by the sixth node, a transistor body of the first NMOS transistor connected to the second voltage supply, a first source/drain (S/D) of the first NMOS transistor connected to the third circuit by the fifth node, and a second S/D of the first NMOS transistor connected to the first feedback transistor by the second node; and the second circuit further comprises:
a first PMOS transistor including a first gate of the first PMOS transistor connected to the third circuit by the fifth node, a transistor body of the first PMOS transistor connected to the first voltage supply, a first S/D of the first PMOS transistor connected to the fourth circuit by the sixth node, and a second S/D of the first PMOS transistor connected to the second feedback transistor by the fourth node.

8. The integrated circuit of claim 7, wherein the third circuit comprises:
a second PMOS transistor including a first S/D of the second PMOS transistor and a transistor body of the second PMOS transistor connected to the first voltage supply, the second PMOS transistor further including a gate of the second PMOS transistor and a second S/D of the second PMOS transistor;
a second NMOS transistor including a first S/D of the second NMOS transistor and a transistor body of the second NMOS transistor connected to the second voltage supply, the second NMOS transistor further including a second S/D of the second NMOS transistor and a gate of the second NMOS transistor connected to the gate of the second PMOS transistor; and
a third NMOS transistor including a first S/D of the third NMOS transistor and a transistor body of the third NMOS transistor connected to the second voltage supply, the third NMOS transistor further including a gate of the third NMOS transistor connected to the second S/D of the second PMOS transistor, and a second S/D of the third NMOS transistor connected to the first S/D of the first NMOS transistor by the fifth node.

9. The integrated circuit of claim 7, wherein the fourth circuit comprises:
a second NMOS transistor including a first S/D of the second NMOS transistor and a transistor body of the second NMOS transistor connected to the second voltage supply, the second NMOS transistor further including a gate of the second NMOS transistor and a second S/D of the second NMOS transistor;
a second PMOS transistor including a first S/D of the second PMOS transistor and a transistor body of the second PMOS transistor connected to the first voltage supply, the second PMOS transistor further including a second S/D of the second PMOS transistor and a gate of the second PMOS transistor connected to the gate of the second NMOS transistor; and
a third PMOS transistor including a first S/D of the third PMOS transistor and a transistor body of the third PMOS transistor connected to the first voltage supply, the third PMOS transistor further including a gate of the third PMOS transistor connected to the second S/D of the second NMOS transistor, and a second S/D of the third PMOS transistor connected to the first S/D of the first PMOS transistor by the sixth node.

10. An integrated circuit, comprising:
a Schmitt trigger circuit, comprising:
a first set of transistors connected between a first voltage supply and an output node, the first voltage supply having a first supply voltage;
a second set of transistors connected between the output node and a second voltage supply different from the first voltage supply, the second voltage supply having a second supply voltage different from the first supply voltage;
a first feedback transistor connected to the output node, a first node and a second node, the first node being between the first set of transistors;
a first circuit electrically connected to the second node, the first voltage supply and the second voltage supply, and the first circuit being configured to supply the second supply voltage to the second node;
a second feedback transistor connected to the output node, a third node and a fourth node, the third node being between the second set of transistors; and
a second circuit electrically connected to the fourth node, the first voltage supply and the second voltage supply, and the second circuit being configured to supply the first supply voltage to the fourth node; and
a gate grounded transistor connected to the Schmitt trigger circuit, and being between the first voltage supply and the second voltage supply.

11. The integrated circuit of claim 10, wherein
the first circuit comprises:
a first N-type metal oxide semiconductor (NMOS) transistor including a first gate, a first source/drain (S/D), a second S/D and a first body terminal, the first gate being connected to the first voltage supply, the first S/D and the first body terminal being connected to the second voltage supply, and the second S/D being connected to at least the second node; and
the second circuit comprises:
a first P-type metal oxide semiconductor (PMOS) transistor including a second gate, a third S/D, a fourth S/D and a second body terminal, the second gate being connected to the second voltage supply, the third S/D and the second body terminal being connected to the first voltage supply, and the fourth S/D being connected to at least the fourth node.

12. An integrated circuit comprising:
a first Schmitt trigger circuit, comprising:
a first set of transistors connected between a first voltage supply and an output node, the first voltage supply having a first supply voltage;
a second set of transistors connected between the output node and a second voltage supply different from the first voltage supply, the second voltage supply having a second supply voltage different from the first supply voltage;
a first feedback transistor connected between the output node, a first node, and a second node, the first node being between a first transistor and a second transistor of the first set of transistors;
a first circuit electrically connected to the second node, the first voltage supply and the second voltage supply, and configured to supply the second supply voltage to the second node;
a second feedback transistor connected between the output node, a third node, and a fourth node, the third node being between a third transistor and a fourth transistor of the second set of transistors; and
a second circuit electrically connected to the fourth node, the first voltage supply and the second voltage supply, and configured to supply the first supply voltage to the fourth node; and
a gate grounded NMOS (GGNMOS) transistor connected between the first voltage supply and the second voltage supply, and being in parallel with the first Schmitt Trigger circuit.

13. The integrated circuit of claim 12, wherein
the first circuit comprises:
a first NMOS transistor including a first gate connected to the first voltage supply, a first source/drain (S/D) and a first transistor body connected to the second voltage supply, and a second S/D connected to at least the second node; and
the second circuit comprises:
a first PMOS transistor including a second gate connected to the second voltage supply, a third S/D and a second transistor body connected to the first voltage supply, and a fourth S/D connected to at least the fourth node.

14. The integrated circuit of claim 13, wherein
the first feedback transistor comprises:
a second PMOS transistor including a third gate connected to at least the output node, a fifth S/D connected to the first node, a third transistor body connected to the first voltage supply, and a sixth S/D connected to the second node and the second S/D; and
the second feedback transistor comprises:
a second NMOS transistor including a fourth gate connected to the output node and the third gate, a seventh source/drain connected to the third node, a fourth transistor body connected to the second voltage supply, and an eighth S/D connected to the fourth node and the third S/D.

15. The integrated circuit of claim 12, wherein the first circuit comprises:
a first PMOS transistor including a first source/drain (S/D) of the first PMOS transistor and a transistor body of the first PMOS transistor connected to the first voltage supply, the first PMOS transistor further including a gate of the first PMOS transistor and a second S/D of the first PMOS transistor;
a first NMOS transistor including a first S/D of the first NMOS transistor and a transistor body of the first NMOS transistor connected to the second voltage supply, the first NMOS transistor further including a second S/D of the first NMOS transistor and a gate of the first NMOS transistor connected to the gate of the first PMOS transistor; and
a second NMOS transistor including a first S/D of the second NMOS transistor and a transistor body of the second NMOS transistor connected to the second voltage supply, the second NMOS transistor further including a gate of the second NMOS transistor connected to the second S/D of the first PMOS transistor, and a second S/D of the second NMOS transistor connected to the second node.

16. The integrated circuit of claim 15, wherein the second circuit comprises:
a third NMOS transistor including a first S/D of the third NMOS transistor and a transistor body of the third NMOS transistor connected to the second voltage supply, the third NMOS transistor further including a gate of the third NMOS transistor and a second S/D of the third NMOS transistor;
a second PMOS transistor including a first S/D of the second PMOS transistor and a transistor body of the second PMOS transistor connected to the first voltage supply, the second PMOS transistor further including a second S/D of the second PMOS transistor and a gate of the second PMOS transistor connected to the gate of the third NMOS transistor; and
a third PMOS transistor including a first S/D of the third PMOS transistor and a transistor body of the third PMOS transistor connected to the first voltage supply, the third PMOS transistor further including a gate of the third PMOS transistor connected to the second S/D of the third NMOS transistor, and a second S/D of the third PMOS transistor connected to the fourth node.

17. The integrated circuit of claim 12, wherein
the first circuit comprises:
a third circuit coupled to at least the first voltage supply and the second voltage supply, and configured to supply the second supply voltage to a fifth node;
the second circuit comprises:
a fourth circuit coupled to at least the first voltage supply and the second voltage supply, and configured to supply the first supply voltage to a sixth node;
the first circuit further comprises:
a first NMOS transistor including a first gate of the first NMOS transistor connected to the fourth circuit by the sixth node, a transistor body of the first NMOS transistor connected to the second voltage supply, a first source/drain (S/D) of the first NMOS transistor connected to the third circuit by the fifth node, and a second S/D of the first NMOS transistor connected to the first feedback transistor by the second node; and
the second circuit further comprises:
a first PMOS transistor including a first gate of the first PMOS transistor connected to the third circuit by the fifth node, a transistor body of the first PMOS transistor connected to the first voltage supply, a first S/D of the first PMOS transistor connected to the fourth circuit by the sixth node, and a second S/D of the first PMOS transistor connected to the second feedback transistor by the fourth node.

18. The integrated circuit of claim 17, wherein the third circuit comprises:
a second PMOS transistor including a first S/D of the second PMOS transistor and a transistor body of the second PMOS transistor connected to the first voltage supply, the second PMOS transistor further including a gate of the second PMOS transistor and a second S/D of the second PMOS transistor;
a second NMOS transistor including a first S/D of the second NMOS transistor and a transistor body of the second NMOS transistor connected to the second voltage supply, the second NMOS transistor further including a second S/D of the second NMOS transistor and a gate of the second NMOS transistor connected to the gate of the second PMOS transistor; and
a third NMOS transistor including a first S/D of the third NMOS transistor and a transistor body of the third NMOS transistor connected to the second voltage supply, the third NMOS transistor further including a gate of the third NMOS transistor connected to the second S/D of the second PMOS transistor, and a second S/D of the third NMOS transistor connected to the first S/D of the first NMOS transistor by the fifth node.

19. The integrated circuit of claim 17, wherein the fourth circuit comprises:
a second NMOS transistor including a first S/D of the second NMOS transistor and a transistor body of the second NMOS transistor connected to the second voltage supply, the second NMOS transistor further including a gate of the second NMOS transistor and a second S/D of the second NMOS transistor;

a second PMOS transistor including a first S/D of the second PMOS transistor and a transistor body of the second PMOS transistor connected to the first voltage supply, the second PMOS transistor further including a second S/D of the second PMOS transistor and a gate of the second PMOS transistor connected to the gate of the second NMOS transistor; and a third PMOS transistor including a first S/D of the third PMOS transistor and a transistor body of the third PMOS transistor connected to the first voltage supply, the third PMOS transistor further including a gate of the third PMOS transistor connected to the second S/D of the second NMOS transistor, and a second S/D of the third PMOS transistor connected to the first S/D of the first PMOS transistor by the sixth node.

\* \* \* \* \*